(12) United States Patent
Kubena et al.

(10) Patent No.: US 10,266,398 B1
(45) Date of Patent: Apr. 23, 2019

(54) ALD METAL COATINGS FOR HIGH Q MEMS STRUCTURES

(71) Applicant: HRL Laboratories, LLC, Malibu, CA (US)

(72) Inventors: Randall L. Kubena, Oak Park, CA (US); Richard J. Joyce, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 163 days.

(21) Appl. No.: 14/555,459

(22) Filed: Nov. 26, 2014

Related U.S. Application Data

(60) Division of application No. 13/363,174, filed on Jan. 31, 2012, and a continuation-in-part of application
(Continued)

(51) Int. Cl.
*H03H 9/02* (2006.01)
*H03H 9/24* (2006.01)
(Continued)

(52) U.S. Cl.
CPC .......... *B81C 1/00206* (2013.01); *C23C 16/06* (2013.01); *C23C 16/45525* (2013.01)

(58) Field of Classification Search
CPC .......... H04R 31/00; H04R 17/10; H03H 9/02; H03H 9/24; H03H 9/241; H03H 9/15;
(Continued)

(56) References Cited

U.S. PATENT DOCUMENTS

| 392,650 A | 11/1888 | Watrous |
| 2,487,165 A | 11/1949 | Miller |
| (Continued) | | |

FOREIGN PATENT DOCUMENTS

| DE | 4442033 | 5/1996 |
| DE | 19719601 | 11/1998 |
| (Continued) | | |

OTHER PUBLICATIONS

Ducument#1 http://hypertextbook.com/facts/2004/ValPolyakov.shtml, no date.*
(Continued)

*Primary Examiner* — Tabassom Tadayyon Eslami
(74) *Attorney, Agent, or Firm* — Ladas & Parry

(57) ABSTRACT

A method for fabricating a Microelectromechanical System (MEMS) resonator includes providing a dielectric substrate defining a resonator and depositing a conductive coating having a resistivity of approximately 1 to 50 $\mu\Omega$-cm on that substrate by Atomic Layer Deposition (ALD). A resonator fabricated according to this process includes a dielectric substrate defining a resonator and a conductive coating having a resistivity of approximately 1 to 50 $\mu\Omega$-cm for electrically coupling the resonator to electronics. Another method for fabricating a MEMS resonator includes providing a dielectric substrate defining a resonator, depositing an aluminum oxide film on that substrate by ALD, and depositing a noble metal film on the aluminum oxide film, also by ALD.

22 Claims, 19 Drawing Sheets

Related U.S. Application Data

No. 13/648,041, filed on Oct. 9, 2012, now Pat. No. 9,046,541, which is a division of application No. 12/488,784, filed on Jun. 22, 2009, now Pat. No. 8,766,745, which is a continuation-in-part of application No. 12/179,579, filed on Jul. 24, 2008.

(60) Provisional application No. 61/082,125, filed on Jul. 18, 2008, provisional application No. 60/962,176, filed on Jul. 25, 2007, provisional application No. 60/973,703, filed on Sep. 19, 2007.

(51) Int. Cl.
   *B81C 1/00* (2006.01)
   *C23C 16/455* (2006.01)
   *C23C 16/06* (2006.01)

(58) Field of Classification Search
   CPC ............ H03H 9/155; H03H 9/17; H03H 9/19; H03H 9/54; H03H 9/52; H01L 41/08
   USPC ....... 73/503.3; 427/250, 395, 255.7; 438/15, 438/55, 64, 106, 6
   See application file for complete search history.

(56) References Cited

U.S. PATENT DOCUMENTS

| | | |
|---|---|---|
| 3,390,287 A | 6/1968 | Hans |
| 3,766,616 A | 10/1973 | Staudte |
| 4,364,016 A | 12/1982 | Tanski |
| 4,426,769 A | 1/1984 | Grabbe |
| 4,442,574 A | 4/1984 | Wanuga et al. |
| 4,447,753 A | 5/1984 | Ochiai |
| 4,618,262 A | 10/1986 | Maydan et al. |
| 4,870,313 A | 9/1989 | Hirama et al. |
| 4,898,031 A | 2/1990 | Oikawa et al. |
| 4,944,836 A | 7/1990 | Beyer et al. |
| 5,203,208 A | 4/1993 | Bernstein |
| 5,226,321 A | 7/1993 | Varnham et al. |
| 5,260,596 A | 11/1993 | Dunn et al. |
| 5,421,312 A | 6/1995 | Dawson |
| 5,480,747 A | 1/1996 | Vasudev |
| 5,530,408 A | 6/1996 | Vig et al. |
| 5,552,016 A | 9/1996 | Ghanayem |
| 5,578,976 A | 11/1996 | Yao et al. |
| 5,589,724 A | 12/1996 | Satoh et al. |
| 5,604,312 A | 2/1997 | Lutz |
| 5,605,490 A | 2/1997 | Laffey et al. |
| 5,644,139 A | 7/1997 | Allen |
| 5,646,346 A | 7/1997 | Okada |
| 5,648,849 A | 7/1997 | Canteloup et al. |
| 5,658,418 A | 8/1997 | Coronel et al. |
| 5,665,915 A | 9/1997 | Kobayashi et al. |
| 5,666,706 A | 9/1997 | Tomita et al. |
| 5,668,057 A | 9/1997 | Eda et al. |
| 5,728,936 A | 3/1998 | Lutz |
| 5,783,749 A | 7/1998 | Lee et al. |
| 5,894,090 A | 4/1999 | Tang et al. |
| 5,905,202 A | 5/1999 | Kubena et al. |
| 5,920,012 A | 7/1999 | Pinson |
| 5,928,532 A | 7/1999 | Koshimizu et al. |
| 5,942,445 A | 8/1999 | Kato et al. |
| 5,959,206 A | 9/1999 | Ryrko |
| 5,981,392 A | 11/1999 | Oishi |
| 5,987,985 A | 11/1999 | Okada |
| 6,009,751 A | 1/2000 | Ljung |
| 6,044,705 A | 4/2000 | Neukermans et al. |
| 6,049,702 A | 4/2000 | Tham |
| 6,081,334 A | 6/2000 | Grimbergen et al. |
| 6,094,985 A | 8/2000 | Kapels et al. |
| 6,114,801 A | 9/2000 | Tanaka et al. |
| 6,145,380 A | 11/2000 | MacGugan et al. |
| 6,151,964 A | 11/2000 | Nakajima |
| 6,155,115 A | 12/2000 | Ljung |
| 6,164,134 A | 12/2000 | Cargille |
| 6,182,352 B1 | 2/2001 | Deschenes et al. |
| 6,196,059 B1 | 3/2001 | Kosslinger |
| 6,204,737 B1 | 3/2001 | Ella |
| 6,207,008 B1 | 3/2001 | Kijima |
| 6,236,145 B1 | 5/2001 | Biernacki |
| 6,250,157 B1 | 6/2001 | Touge |
| 6,263,552 B1 | 7/2001 | Takeuchi et al. |
| 6,282,958 B1 | 9/2001 | Fell et al. |
| 6,289,733 B1 | 9/2001 | Challoner et al. |
| 6,297,064 B1 | 10/2001 | Koshimizu |
| 6,349,597 B1 | 2/2002 | Folkmer et al. |
| 6,367,326 B1 | 4/2002 | Okada |
| 6,367,786 B1 | 4/2002 | Gutierrez et al. |
| 6,413,682 B1 | 7/2002 | Shibano et al. |
| 6,417,925 B1 | 7/2002 | Naya |
| 6,424,418 B2 | 7/2002 | Kawabata et al. |
| 6,426,296 B1 | 7/2002 | Okojie |
| 6,432,824 B2 | 8/2002 | Yanagisawa |
| 6,481,284 B2 | 11/2002 | Geen et al. |
| 6,481,285 B1 | 11/2002 | Shkel et al. |
| 6,492,195 B2 | 12/2002 | Nakanishi |
| 6,513,380 B2 | 2/2003 | Reeds et al. |
| 6,514,767 B1 | 2/2003 | Natan |
| 6,515,278 B2 | 2/2003 | Wine et al. |
| 6,571,629 B1 | 6/2003 | Kipp |
| 6,584,845 B1 | 7/2003 | Gutierrez et al. |
| 6,614,529 B1 | 9/2003 | Tang |
| 6,621,158 B2 | 9/2003 | Martin et al. |
| 6,627,067 B1 | 9/2003 | Branton et al. |
| 6,628,177 B2 | 9/2003 | Clark et al. |
| 6,629,460 B2 | 10/2003 | Challoner |
| 6,651,027 B2 | 11/2003 | McCall |
| 6,710,681 B2 | 3/2004 | Figueredo |
| 6,715,352 B2 | 4/2004 | Tracy |
| 6,744,335 B2 | 6/2004 | Ryhanen |
| 6,750,728 B2 | 6/2004 | Takahashi et al. |
| 6,756,304 B1 | 6/2004 | Robert |
| 6,768,396 B2 | 7/2004 | Klee |
| 6,796,179 B2 | 9/2004 | Bae et al. |
| 6,806,557 B2 | 10/2004 | Ding |
| 6,815,228 B2 | 11/2004 | Usui et al. |
| 6,856,217 B1 | 2/2005 | Clark et al. |
| 6,862,398 B2 | 3/2005 | Elkind et al. |
| 6,883,374 B2 | 4/2005 | Fell et al. |
| 6,915,215 B2 | 7/2005 | M'Closkey et al. |
| 6,933,164 B2 | 8/2005 | Kubena |
| 6,943,484 B2 | 9/2005 | Clark et al. |
| 6,944,931 B2 | 9/2005 | Shcheglov et al. |
| 6,985,051 B2 | 1/2006 | Nguyen et al. |
| 7,040,163 B2 | 5/2006 | Shcheglov |
| 7,057,331 B2 | 6/2006 | Shimodaira et al. |
| 7,118,657 B2 | 10/2006 | Golovchenko et al. |
| 7,152,290 B2 | 12/2006 | Junhua et al. |
| 7,168,318 B2 | 1/2007 | Challoner et al. |
| 7,211,933 B2 | 5/2007 | Kawakubo |
| 7,224,245 B2 | 5/2007 | Song |
| 7,232,700 B1 | 6/2007 | Kubena |
| 7,234,214 B2 | 6/2007 | Xu |
| 7,237,315 B2 | 7/2007 | Kubena et al. |
| 7,270,884 B2 * | 9/2007 | Lian ................. H01L 28/65 428/446 |
| 7,295,088 B2 | 11/2007 | Nguyen |
| 7,317,354 B2 | 1/2008 | Lee |
| 7,347,095 B2 | 3/2008 | Shcheglov |
| 7,401,397 B2 | 7/2008 | Shcheglov |
| 7,446,628 B2 | 11/2008 | Morris, III |
| 7,459,099 B2 | 12/2008 | Kubena et al. |
| 7,459,992 B2 | 12/2008 | Matsuda et al. |
| 7,479,846 B2 | 1/2009 | Inoue |
| 7,490,390 B2 | 2/2009 | Kawakubo et al. |
| 7,493,814 B2 | 2/2009 | Whelan |
| 7,543,496 B2 | 6/2009 | Ayazi |
| 7,551,054 B2 | 6/2009 | Mizuno |
| 7,555,824 B2 | 7/2009 | Chang |
| 7,557,493 B2 | 7/2009 | Fujimoto |
| 7,559,130 B2 | 7/2009 | Kubena et al. |
| 7,564,177 B2 | 7/2009 | Yoshimatsu |
| 7,579,748 B2 | 8/2009 | Kuroda |

(56) References Cited

U.S. PATENT DOCUMENTS

| | | |
|---|---|---|
| 7,579,926 B2 | 8/2009 | Jhung |
| 7,581,443 B2 | 9/2009 | Kubena |
| 7,624,494 B2 | 12/2009 | Challoner |
| 7,663,196 B2 | 2/2010 | Liu |
| 7,671,427 B2 | 3/2010 | Kim et al. |
| 7,675,224 B2 | 3/2010 | Tanaya |
| 7,690,095 B2 | 4/2010 | Takahashi |
| 7,750,535 B2 | 7/2010 | Kubena |
| 7,757,393 B2 | 7/2010 | Ayazi et al. |
| 7,791,431 B2 | 9/2010 | Piazza et al. |
| 7,793,541 B2 | 9/2010 | Challoner |
| 7,802,356 B1 | 9/2010 | Chang |
| 7,830,074 B2 | 11/2010 | Kubena |
| 7,836,765 B2 | 11/2010 | Challoner |
| 7,872,548 B2 | 1/2011 | Nishihara et al. |
| 7,878,064 B2 | 2/2011 | Abbott |
| 7,884,930 B2 | 2/2011 | Kirby |
| 7,895,892 B2 | 3/2011 | Aigner |
| 7,958,781 B2 | 6/2011 | Fell |
| 7,987,714 B2 | 8/2011 | DeNatale |
| 7,994,877 B1 | 8/2011 | Kubena |
| 8,138,016 B2 | 3/2012 | Chang |
| 8,151,640 B1 | 4/2012 | Kubena |
| 8,176,607 B1 | 5/2012 | Kubena |
| 8,205,495 B2 | 6/2012 | Challoner |
| 8,322,028 B2 | 12/2012 | Ge |
| 8,381,590 B2 | 2/2013 | Ikeda |
| 8,393,212 B2 | 3/2013 | Ge |
| 8,522,612 B1 | 9/2013 | Kubena |
| 8,567,041 B1 * | 10/2013 | Roper ............ H04R 31/00 216/62 |
| 8,593,037 B1 | 11/2013 | Kubena |
| 8,766,745 B1 * | 7/2014 | Kubena ........... H03H 3/0072 333/186 |
| 8,769,802 B1 | 7/2014 | Chang et al. |
| 8,782,876 B1 | 7/2014 | Kubena et al. |
| 8,912,711 B1 | 12/2014 | Chang et al. |
| 9,046,541 B1 | 6/2015 | Kubena et al. |
| 2002/0066317 A1 | 6/2002 | Lin |
| 2002/0072246 A1 | 6/2002 | Goo et al. |
| 2002/0074947 A1 | 6/2002 | Tsukamoto |
| 2002/0107658 A1 | 8/2002 | McCall |
| 2002/0185611 A1 | 12/2002 | Menapace et al. |
| 2003/0003608 A1 | 1/2003 | Arikado et al. |
| 2003/0010123 A1 | 1/2003 | Malvern et al. |
| 2003/0029238 A1 | 2/2003 | Challoner |
| 2003/0196490 A1 | 10/2003 | Cardarelli |
| 2003/0205948 A1 | 11/2003 | Lin |
| 2004/0055380 A1 | 3/2004 | Shcheglov et al. |
| 2004/0055381 A1 | 3/2004 | Shcheglov |
| 2004/0065864 A1 | 4/2004 | Vogt et al. |
| 2004/0189311 A1 | 9/2004 | Glezer |
| 2004/0211052 A1 | 10/2004 | Kubena et al. |
| 2005/0034822 A1 | 2/2005 | Kim et al. |
| 2005/0062368 A1 | 3/2005 | Hirasawa |
| 2005/0093659 A1 | 5/2005 | Larson |
| 2005/0156309 A1 | 7/2005 | Fujii |
| 2005/0172714 A1 | 8/2005 | Challoner |
| 2005/0260792 A1 | 11/2005 | Patel |
| 2005/0274183 A1 | 12/2005 | Shcheglov |
| 2006/0016065 A1 | 1/2006 | Nagaura |
| 2006/0022556 A1 | 2/2006 | Bail et al. |
| 2006/0055479 A1 | 3/2006 | Okazaki et al. |
| 2006/0066419 A1 | 3/2006 | Iwaki |
| 2006/0139121 A1 | 6/2006 | Jhung |
| 2006/0162146 A1 * | 7/2006 | Shcheglov ......... G01C 19/5684 29/594 |
| 2006/0197619 A1 | 9/2006 | Oishi et al. |
| 2006/0213266 A1 | 9/2006 | French |
| 2006/0252906 A1 | 11/2006 | Godschalx et al. |
| 2006/0255691 A1 | 11/2006 | Kuroda |
| 2007/0017287 A1 * | 1/2007 | Kubena ............. G01C 19/5684 73/504.02 |
| 2007/0034005 A1 | 2/2007 | Acar |
| 2007/0084042 A1 | 4/2007 | Challoner |
| 2007/0205839 A1 | 9/2007 | Kubena et al. |
| 2007/0220971 A1 | 9/2007 | Ayazi |
| 2007/0240508 A1 | 10/2007 | Watson |
| 2008/0034575 A1 | 2/2008 | Chang et al. |
| 2008/0074661 A1 | 3/2008 | Zhang |
| 2008/0096313 A1 | 4/2008 | Patel |
| 2008/0148846 A1 | 6/2008 | Whelan |
| 2008/0295622 A1 | 12/2008 | Challoner |
| 2009/0095077 A1 | 4/2009 | DeNatale |
| 2009/0146527 A1 | 6/2009 | Lee |
| 2009/0189294 A1 | 7/2009 | Chang |
| 2010/0020311 A1 | 1/2010 | Kirby |
| 2010/0024560 A1 | 2/2010 | Shcheglov |
| 2010/0148803 A1 | 6/2010 | Ohnish |
| 2010/0251817 A1 | 10/2010 | Ge |
| 2010/0251818 A1 | 10/2010 | Ge |
| 2011/0107838 A1 | 5/2011 | Suijlen |
| 2012/0000288 A1 | 1/2012 | Matsuura |
| 2012/0212109 A1 | 8/2012 | Yamazaki |
| 2012/0266682 A1 | 10/2012 | Torashima |

FOREIGN PATENT DOCUMENTS

| | | |
|---|---|---|
| EP | 461761 | 12/1991 |
| EP | 0 531 985 | 3/1993 |
| EP | 1055908 | 11/2000 |
| EP | 971208 | 12/2000 |
| JP | 57-091017 | 6/1982 |
| JP | 401129517 | 5/1989 |
| JP | 4322507 | 11/1992 |
| JP | 5286142 | 11/1993 |
| JP | 6232678 | 8/1994 |
| JP | 6-318533 | 11/1994 |
| JP | 8330878 | 12/1996 |
| JP | 9-247025 | 9/1997 |
| JP | 2003-318685 A | 11/2003 |
| JP | 2005-180921 A | 7/2005 |
| JP | 2006-352487 | 12/2006 |
| KR | 10-2001-0110428 A | 12/2001 |
| WO | 84-00082 | 1/1984 |
| WO | 96/38710 | 12/1996 |
| WO | 98/15799 | 4/1998 |
| WO | 00/68640 | 11/2000 |
| WO | 01/44823 | 6/2001 |
| WO | 01/74708 | 10/2001 |
| WO | 02/12873 | 2/2002 |
| WO | 2005/121769 | 12/2005 |
| WO | 2006/010206 | 2/2006 |
| WO | 2006/103439 | 10/2006 |

OTHER PUBLICATIONS

M. McNie et al, Microzyztem technologies 6(2000)184-188.*

Jeffrey W. Elam et al, Journal of Nanomaterails vol. 2006, Article ID 64501, pp. 1-5, 2006.*

U.S. Appl. No. 11/458,911, filed Jul. 20, 2006, Kubena et al.

U.S. Appl. No. 11/881,461, filed Jul. 27, 2007, Kubena et al.

U.S. Appl. No. 12/026,486, filed Feb. 5, 2008, Kubena.

U.S. Appl. No. 12/179,579, filed Jul. 24, 2008, Kubena.

U.S. Appl. No. 13/363,174, filed Jan. 31, 2012, Kubena et al.

Aaltonen, T., et al. "ALD of rhodium thin films from RH(acach and oxygen." Electrochemical and Solid-State Letters, 8{8), C99-C101 (2005). Laboratory of Inorganic Chemistry, Department of Chemistry, the University of Helsinki, Helsinki, Finland.

Abe,T., et al., "One-Chip Multichannel Quartz Crystal Microbalance (QCM) Fabricated by Deep RIE," Sensors and Actuators, 2000, pp. 139-143.

Barbour et al., "Micromechanical Silicon Instrument and Systems Development at Draper Laboratory," AIAA Guidance Navigation and Control Conference, 1996, Paper No. 96-3709.

Burdess et al., "The Theory of a Piezoelectric Disc Gyroscope", Jul. 1986, IEEE vol. AES 22, No. 4; p. 410-418.

Cleland, A.N., et al., "Fabrication of High Frequency Nanometer Scale Mechanical Resonators From Bulk Si Crystals," Applied Physics Letters, Oct. 28, 1996, pp. 2653-2655.

(56) References Cited

OTHER PUBLICATIONS

Evoy, S., et al., "Temperature-dependent Internal Friction in Silicon Nanoelectromechanical Systems," Applied Physics Letters, vol. 77, No. 15, Oct. 9, 2010.
Fujita et al., "Disk-shaped bulk micromachined gyroscope with vacuum sealing," Sensors and Actuators A:Physical, vol. 82, May 2000, pp. 198-204.
Greer, J.A., et al., "Properties of SAW resonators fabricated on quartz substrates of various qualities," Ultrasonics Symposium, 1994 IEEE, vol. 1, Nov. 1-4, 1994, pp. 31-36.
J.-M. Friedt and É. Carry, "*Introduction to the quartz tuning fork*", American Journal of Physics 75, 415 (2007), pp. 415-422.
Johnson et al., "Surface Micromachined Angular Rate Sensor," A1995 SAE Conference, Paper No. 950538, pp. 77-83.
Lin, J.W., et al., "A Robust High-Q Micromachined RF Inductor for RFIC Applications," IEEE Transactions on Electronic Devices, vol. 52, No. 7, pp. 1489-1496 (Jul. 2005).
Park, K.J. and Parsons, G.N. "Selective area atomic layer deposition of rhodium and effective work function characterization in capacitor structures." Applied Physics Letters, 89, pp. 043111-1 to 043111-3 (2006.
Putty et al., "A Micromachined Vibrating Ring Gyroscope," Solid State Sensor and Actuator Workshop, Transducer Research Foundation, Hilton Head, 1994, pp. 213-220.
Sirbuly, Donald J. et al., Multifunctional Nanowire Evanescent Wave Optical Sensors, Advanced Materials, 2007 (published online: Dec. 5, 2006), 19, pp. 61-66.
Skulski et al., "Planar resonator sensor for moisture measurements", Microwaves and Radar, 1998, MIKON '98, 12th International Conf., vol. 3, May 20-22, 1998, pp. 692-695.
Tang et al., "A Packaged Silicon MEMS Vibratory Gyroscope for Microspacecraft," Proceedings IEEE, 10th Annual Int. Workshop on MEMS, Japan, 1997, pp. 500-505.
Tang et al., "Silicon Bulk Micromachined Vibratory Gyroscope," Jet Propulsion Lab (6 pages).
White, Lan M., et al., Increasing the Enhancement of SERS with Dielectric Microsphere Resonators, Spectroscopy—Eugene, Apr. 2006.
Wright et al., "The HRG Applied to a Satellite Attitude Reference System," Guidance and Control, AASAAS, 1994, 86: pp. 55-67.
Yan, Fei, et al.,"Surface-enhanced Raman scattering (SERS) detection for chemical and biological agents," IEEE Sensors Journal, vol. 5, No. 4, Aug. 2005.
From U.S. Appl. No. 10/426,931 (now U.S. Pat. No. 7,237,315), Application and Office Actions including but not limited to the Office Actions dated Jun. 16, 2004, Aug. 31, 2004, Dec. 8, 2004, May 16, 2005, Aug. 11, 2005, Jan. 20, 2006, Jul. 11, 2006, Sep. 13, 2006, Oct. 24, 2006, and Feb. 1, 2007.
From U.S. Appl. No. 11/043,378 (now U.S. Pat. No. 7,459,099), Application and Office Actions, including but not limited to the Office Actions dated Aug. 11, 2006, Dec. 6, 2006, May 25, 2007, Sep. 12, 2007, Jan. 15, 2008, and Aug. 4, 2008.
From U.S. Appl. No. 11/458,911 (now U.S. Pat. No. 7,581,443), Application and Office Actions, including but not limited to the Office Actions dated Oct. 12, 2007, Apr. 17, 2008, Jul. 2, 2008, Sep. 17, 2008, and Apr. 23, 2009.
From U.S. Appl. No. 11/502,336 (now U.S. Pat. No. 7,555,824), Application and Office Actions, including but not limited to the Office Actions dated Nov. 14, 2008, Jan. 23, 2009, and Mar. 20, 2009.
From U.S. Appl. No. 11/800,289 (now U.S. Pat. No. 7,559,130), Application and Office Actions including but not limited to the Office Actions dated Oct. 24, 2008 and Mar. 25, 2009.
From U.S. Appl. No. 11/800,294 (now U.S. Pat. No. 7,750,535), Application and Office Actions, including but not limited to the Office Actions dated Jul. 29, 2009 and Nov. 30, 2009.
From U.S. Appl. No. 11/881,461 (now U.S. Pat. No. 7,830,074), Application and Office Actions, including but not limited to the Office Actions dated Jun. 16, 2009, Oct. 19, 2009, Jun. 2, 2010, Jul. 13, 2010, and Sep. 24, 2010.
From U.S. Appl. No. 12/027,247 (now U.S. Pat. No. 8,151,640), Application and Office Actions, including but not limited to the Office Actions dated Feb. 16, 2011, Jun. 7, 2011, and Dec. 8, 2011.
From U.S. Appl. No. 12/034,852 (now U.S. Pat. No. 7,802,356), Application and Office Actions, including but not limited to the Office Actions dated Oct. 2, 2009, Jan. 28, 2010, and May 19, 2010.
From U.S. Appl. No. 12/145,678 (now U.S. Pat. No. 7,884,930), Application and Office Actions, including but not limited to the Office Actions dated including those dated Jul. 22, 2009, Jan. 14, 2010, Mar. 26, 2010, and Jul. 13, 2010.
From U.S. Appl. No. 12/179,579, Application and Office Actions, including but not limited to the office action dated Dec. 9, 2010.
From U.S. Appl. No. 12/268,309 (now U.S. Pat. No. 7,994,877), Application and Office Actions, including but not limited to the Office Actions dated Aug. 20, 2010, Nov. 22, 2010, and Apr. 4, 2011.
From U.S. Appl. No. 12/399,680 (now U.S. Pat. No. 8,138,016), Application and Office Actions, including but not limited to the Office Action dated Jun. 7, 2011, Aug. 4, 2011, and Nov. 14, 2011.
From U.S. Appl. No. 12/488,784 (now U.S. Pat. No. 8,766,745) Application and Office Actions, including but not limited to the Office Actions dated Apr. 30, 2012, Aug. 1, 2012, Jan. 3, 2013, Jun. 4, 2013, Oct. 3, 2013 and Feb. 20, 2014.
From U.S. Appl. No. 12/575,634 (now U.S. Pat. No. 8,176,607), Application and Office Actions, including but not limited to Office Actions dated Mar. 23, 2011, Jul. 11, 2011, Oct. 17, 2011, and Jan. 9, 2012.
From U.S. Appl. No. 12/820,761 (now U.S. Pat. No. 8,912,711) Application and Office Actions, including but not limited to the Office Actions dated Jan. 9, 2012, Feb. 23, 2012, Jun. 25, 2012, Sep. 6, 2012, Nov. 2, 2012, Mar. 19, 2013, Jul. 24, 2013, Nov. 19, 2013, Mar. 7, 2014, Jul. 1, 2014, Aug. 15, 2014.
From U.S. Appl. No. 12/831,028 (now U.S. Pat. No. 8,769,802) Application and Office Actions, including but not limited to the Office Action dated Apr. 11, 2012, Nov. 7, 2013 and Feb. 27, 2014.
From U.S. Appl. No. 13/163,357 (now U.S. Pat. No. 8,782,876) Application and Office Actions, including but not limited to the Office Actions dated Mar. 1, 2013, Aug. 19, 2013, and Mar. 13, 2014.
From U.S. Appl. No. 13/363,174 (unpublished) Office Action dated Aug. 27, 2014.
From U.S. Appl. No. 13/410,998 (now U.S. Pat. No. 8,522,612) Application and Office Actions, including but not limited to the Office Action dated Apr. 11, 2013.
From U.S. Appl. No. 13/434,144 (now U.S. Pat. No. 8,593,037) Application and Office Actions, including but not limited to the Office Action dated Jul. 11, 2013.
From U.S. Appl. No. 13/648,041 (now U.S. Pat. No. 9,046,541) Office Action dated Sep. 5, 2014 and Jan. 16, 2015.

\* cited by examiner

ALD METAL COATINGS FOR HIGH Q MEMS STRUCTURES

CROSS-REFERENCE TO RELATED APPLICATIONS

This application is related to U.S. patent application Ser. No. 11/458,911, filed Jul. 20, 2006 and entitled "DISC RESONATOR GYROSCOPES," the contents of which are hereby expressly incorporated herein in their entirety. The inventor named in this application is a named co-inventor in the Ser. No. 11/458,911 application. The inventor named in this application has further developed and made subsequent improvements to certain features disclosed in the Ser. No. 11/458,911 application which reflect what is believed to be the best mode for practicing those features. This application includes disclosure of those developments and improvements. The present application is a divisional application based on U.S. patent application Ser. No. 13/363,174 filed Jan. 31, 2012, the contents of which are hereby expressly incorporated herein by reference.

This application is also a continuation in part of U.S. patent application Ser. No. 13/648,041 filed Oct. 9, 2012, which application is in turn a division of U.S. patent application Ser. No. 12/488,784 filed Jun. 22, 2009. U.S. patent application Ser. No. 12/488,784 is in turn a continuation in part of U.S. patent application Ser. No. 12/179,579 filed Jul. 24, 2008 and also claims the benefit of U.S. Provisional Patent Application No. 61/082,125 filed Jul. 18, 2008.

U.S. patent application Ser. No. 12/179,579 filed Jul. 24, 2008 claims the benefit of two U.S. Provisional Patent Applications: (1) U.S. Provisional Patent Application No. 60/962,176 filed Jul. 25, 2007; and (2) U.S. Provisional Patent Application No. 60/973,703 filed Sep. 19, 2007.

This application is also related to the following United States patent applications which are all incorporated herein in their entirety: U.S. patent application Ser. No. 10/426,931, filed on Apr. 30, 2003, entitled "A METHOD FOR FABRICATING A RESONATOR," and now issued as U.S. Pat. No. 7,237,315; U.S. patent application Ser. No. 11/881,461, filed on Jul. 27, 2007 and entitled "AN INTEGRATED QUARTZ OSCILLATOR ON AN ACTIVE ELECTRONIC SUBSTRATE;" and U.S. patent application Ser. No. 12/268,309, filed on Nov. 10, 2008, and entitled "MEMS-BASED QUARTZ HYBRID FILTERS."

STATEMENT REGARDING FEDERALLY SPONSORED RESEARCH OR DEVELOPMENT

The present invention was made with support from the United States Government under contract number FA8650-05-C-7245 awarded by the Defense Advanced Research Projects Agency (DARPA). The United States Government has certain rights in the invention.

BACKGROUND

Technical Field

The present invention generally relates to MEMS structures and methods for fabricating such structures. More particularly, the present invention relates to conductive coatings on MEMS structures and methods for forming conductive coatings on MEMS structures.

Related Art

Microelectromechanical systems (MEMS) technology relates to the small scale integration of mechanical structures with electronics. In general, MEMS structures are formed on a substrate using micromachining techniques in which layers are added to the substrate and in which material is selectively removed from the substrate and/or added material layers. The electronics are formed using conventional integrated circuit (IC) techniques.

Resonators are fundamental to RF architectures and can be used as, for example, filters and oscillators, in MEMS devices. MEMS devices which consist of silicon-based resonators have been fabricated in an attempt to integrate nanoresonators or microresonators with other electronics. Nanoresonators and microresonators are resonators which have linear dimensions on the order of nanometers and micrometers, respectively. As used herein, 'resonator' refers to any resonator incorporated in, or coupled to, a MEMS device and includes both nanoresonators and microresonators. Silicon-based resonators have shown resonant frequencies as high as 600 MHz. However, a problem with silicon-based resonators is that they have high electrical impedances and low quality factors.

Quality factor (Q) is a measure of the frequency sensitivity of a resonate body and is related to how well a resonator traps oscillation energy. In other words, a resonator with a high Q exhibits low energy loss. Thus, the higher the value of Q, the better the resonator performance, and ultimately the better the performance of the overall MEMS device. A high Q factor is especially important for improving electrical functionalities in MEMS devices for RF applications.

One of the fundamental energy loss mechanisms in a resonating solid is thermolastic damping, which is caused by irreversible heat flows in the solid as it oscillates. The magnitude of energy loss depends on the thermal conductivity of the particular substrate material of which that solid is formed. Thus, for a given geometry and a fixed temperature, Q is strongly material dependent.

Because quartz can have lower intrinsic damping than other resonator materials, the use of quartz structures in MEMS resonators is highly desirable. Quartz-based resonators are known to have a Q several orders of magnitude larger than silicon-based resonators with similar geometry.

For at least shear-mode piezoelectric resonators, thickness of the resonator determines resonant frequency. The thinner the resonator, the higher the resonant frequency. Techniques for thinning quartz resonators to obtain high resonate frequencies are known. However, another factor that influences how well oscillation energy is trapped is resonator surface smoothness. A rough or damaged surface increases a resonator's surface-to-volume ratio, which in turn increases dissipation of oscillation energy. Thus, when thinning a quartz structure to obtain a high resonate frequency, it is desirable to maintain a smooth, undamaged surface to ensure a high Q.

U.S. patent application Ser. No. 10/426,931 for "A METHOD FOR FABRICATING A RESONATOR," published as 200410211052 and now issued as U.S. Pat. No. 7,237,315, is co-owned with the present application and is incorporated herein in its entirety. The U.S. Pat. No. 7,237,315 patent relates to a method for fabricating a quartz nanoresonator that can be integrated on a substrate along with other electronics, disclosing methods for fabricating and integrating quartz-based resonators on a high speed substrate for integrated signal processing that utilize a combination of novel bonding and etching steps to form smooth, ultra-thin quartz-based resonators. The quartz resonators made in accordance with these methods can achieve a frequency in excess of 1 GHz.

U.S. patent application Ser. No. 11/881,461 for "AN INTEGRATED QUARTZ OSCILLATOR ON AN ACTIVE ELECTRONIC SUBSTRATE" is also co-owned with the current application and incorporated herein in its entirety. The Ser. No. 11/881,461 application discloses methods to attach a full wafer of quartz resonators to a substrate wafer using low temperature bonding, allowing a complete integration of a wafer of resonators to a wafer containing an array of oscillator circuits. As well, the Ser. No. 11/881,461 application also discloses integrating a quartz resonator with active electronics to form a low power, high performance (low vibration sensitivity, low temperature drift, and low phase noise) oscillator with reduced stray signals.

Quartz is an insulating material. Thus, to electrostatically drive or sense motion of a quartz-based resonator, the resonator's surface must be made conductive by forming an electrically continuous metal film thereon for electrodes. The thickness of the metal film, as well as the uniformity of that thickness, affects both resonate frequency and native Q of the resonator. The conductivity of the metal film affects RC time constants and impedances, which are critical for high performance in many MEMS devices. For example, electrically continuous thin metal coatings are desired for high frequency (>2 GHz) oscillators and high performance quartz filters. The isolation and bandwidth of high performance quartz filters depend on making metal electrodes with ultrathin films for optimal modal properties. For oscillators, a thick metal electrode reduces the frequency and can reduce the resulting Q. Therefore, the best performing oscillators typically have very thin electrodes.

Deposition of metal coatings on electronic and MEMS structures has been restricted to the conventional thin film processes of sputtering, electron beam evaporation, or thermal evaporation. These processes are only slightly conformal (with sputtering being the best) on high-aspect-ratio structures, as these processes generally coat structures along a line-of-sight from the source, resulting in non-uniform thickness metal films which introduce stress gradients over temperature, degrading Q. Chemical Vapor Deposition (CVD) processes are more conformal than sputtering, electron beam evaporation, or thermal evaporation, but are not able to produce substantially pure metal films, desired for high conductivity.

Another problem with sputtering, electron beam evaporation, or thermal evaporation processes is the films generally form grain structures due to the kinetics of the growth process. Slippage between these grains during mechanical bending results in energy loss, degrading Q. Also, the grain structure limits the minimum thickness which can be applied in order to obtain electrically continuous films, also degrading Q as well as resonate frequency. The thickness of the metal film cannot be controlled on the monolayer scale using these processes.

Atomic Layer Deposition (ALD) is a gas phase chemical process used to form extremely thin conformal coatings on a substrate and/or structure. ALD is similar in chemistry to CVD, except that the ALD reaction breaks the CVD reaction into two sequential self-limited reactions between gas phase reactants (also known as precursors) and the growth surface Because ALD film growth is self-limited it is possible to control deposition on the atomic scale, as fine as approximately 0.1 angstroms (0.01 nanometer) or a fraction of a monolayer. ALD has unique advantages over other thin film deposition techniques, as ALD grown films are highly conformal, amorphous or polycrystalline and chemically bonded to the substrate with essentially fine grain structure. In addition, since the reactions only occur at the surface as opposed to in the gas phase as in CVD, no particulates are produced and the surface finish reproduces the original surface topology.

The use of ALD for ultra-thin film deposition of dielectrics has been used for several years in the IC industry, primarily in the fabrication of gate insulators and conformal passivation layers. However, successful demonstration of methods and chemistry to deposit relatively thick pure metal films by Atomic Layer Deposition techniques was only first reported in 2005. (See Solid-State Lett. 8, C99 (2005). See also APL, Vol. 89, pp. 043111-1 to 043111-3 (2006).) In these ALD metal processes a metal precursor is introduced into a vacuum chamber. The metal precursor reacts with functional groups, usually oxygen, on the growth surface to deposit a monolayer of the desired metal. This precursor and oxidized hydrocarbon ligands from the precursors are then purged from the system. Next, a second precursor, such as oxygen, is introduced into the system. The second precursor combines with unreacted ligands on the surface and the metal to produce a clean oxide surface. Byproducts of water and carbon dioxide are produced, which are pumped away. The thicknesses of the metal films made by ALD were in the range of 30 nm to 100 nm and the resistivities of these metal films were consistent with the resistivity of bulk metal.

Co-pending U.S. patent application Ser. No. 11/458,911, filed Jul. 20, 2006 and in which the inventor of the instant application is a named co-inventor, recognized the potential benefits of using ALD metal films as conductive coatings on MEMS resonators. Disclosed below is subsequent development of, and improvement to, that recognized in the Ser. No. 11/458,911 application.

SUMMARY

In accordance with a first embodiment of the present invention, a MEMS resonator is provided that includes a dielectric substrate defining a resonator and a conductive coating, formed by Atomic Layer Deposition (ALD), having a resistivity of near bulk metal values of approximately 1 to 50 $\mu\Omega$-cm. The conductive coating electrically couples the resonator to electronics, such as to drive or sense movement.

The resonator can be used as a part of an oscillator or filter. The resonator can be a disc resonator. In such a case, the disc resonator can be used in a disc resonator gyroscope (DRG). The resonator can also be a shear-mode piezoelectric resonator. In such a case, the resonator can have a fundamental mode resonance of greater than 100 MHz. As well, the resonator can be a high-aspect-value resonator, having an aspect ratio greater than 2:1, or even greater than 5:1.

According to one aspect of this embodiment, the conductive coating is less than 100 nm thick, and in another aspect, the conductive coating has a resistivity of approximately $10^{-6}$ to $10^{-5}$ $\Omega$-cm. In still another aspect the dielectric substrate is one of quartz, fused quartz, or fused silica.

According to yet another aspect, the conductive coating is a metal film. In a further aspect, the metal is a noble metal. In a still further aspect, the noble metal is one of Ru, Rh, Pd, Re, Ir, or Pt. According to another further aspect, the metal film has a thickness of 1 to 20 nm. And in yet another further aspect, the metal film is a pure metal film.

In still another aspect, the conductive coating is a bilayer coating in which each of two layers is formed by ALD. The first layer is a dielectric layer formed on the substrate, and the second layer is a metal layer that is formed on the first layer. Because of the dielectric layer, the resonator has a higher Q than if the conductive coating consisted of only the metal layer. The dielectric layer reduces surface interfacial slippage and provides surface passivation, resulting in the higher Q. This layer also enhances the adhesion of the conductive layer.

In another aspect, the conductive coating comprises a dielectric film and a metal film. The dielectric film is formed on the dielectric substrate using Atomic Layer Deposition. The dielectric film is for reducing surface interfacial slippage and providing surface passivation. The metal film is formed on the dielectric film, also using Atomic Layer Deposition.

In a further aspect, the dielectric film is an $Al_2O_3$ amorphous film, and the metal film is a noble metal film. Further still, the $Al_2O_3$ amorphous film has a thickness of 1 to 2 nm, and the noble metal film has a thickness of 1 to 20 nm. And, in a yet still further aspect, the noble metal film is a pure noble metal film, and the noble metal is one of Ru, Rh, Pd, Re, Ir, or Pt.

Also provided is a method for fabricating a MEMS resonator in accord with this first embodiment of the present invention. This method includes providing a dielectric substrate having a resonator defined therein and depositing a conductive coating having a resistivity of approximately 1 to 50 µΩ-cm on the dielectric substrate by Atomic Layer Deposition, the conductive coating for electrically coupling the resonator to electronics.

In accordance with another embodiment of the present invention, a MEMS resonator is provided that includes a dielectric substrate having a resonator defined therein, an $Al_2O_3$ amorphous film formed on the substrate by Atomic Layer Deposition, and a noble metal film formed on the dielectric film by Atomic Layer Deposition to electrically couple the resonator to electronics.

As with the resonator in accordance with the first embodiment of the invention, this resonator can be used as a part of an oscillator or filter. This resonator can be a disc resonator. In such a case, the disc resonator can be used in a disc resonator gyroscope (DRG). This resonator can also be a shear-mode piezoelectric resonator. In such a case, the resonator can have a fundamental mode resonance of greater than 100 MHz. As well, this resonator can be a high-aspect-value resonator, having an aspect ratio greater than 2:1, or even greater than 5:1.

According to one aspect of this embodiment, the noble metal film has a resistivity of 1 to 50 µΩ-cm. In another aspect, the $Al_2O_3$ amorphous film and the noble metal film each have a uniform thickness. In still another aspect, the $Al_2O_3$ amorphous film reduces surface interfacial slippage and provides surface passivation.

Also provided is a method for fabricating a MEMS resonator in accord with this other embodiment of the present invention. This method includes providing a dielectric substrate having a resonator defined therein, depositing an $Al_2O_3$ amorphous film on the dielectric substrate by Atomic Layer Deposition, and depositing a noble metal film on the deposited $Al_2O_3$ amorphous film, also using Atomic Layer Deposition, the noble metal film for electrically coupling the resonator to electronics. In one aspect, the dielectric substrate is placed in a vacuum chamber, a vacuum is created in the vacuum chamber, and the $Al_2O_3$ amorphous film and the noble metal film are then deposited without breaking the created vacuum.

BRIEF DESCRIPTION OF THE DRAWINGS

The present invention will be understood and appreciated more fully from the following detailed description taken in conjunction with the drawings in which.

DETAILED DESCRIPTION

The present invention will now be described more fully hereinafter with reference to the accompanying drawings, in which preferred embodiments of the invention are shown. This invention may be embodied in many different forms and should not be construed as limited to the embodiments set forth herein.

Bilayer High Q Coating and Method

Figure 7:
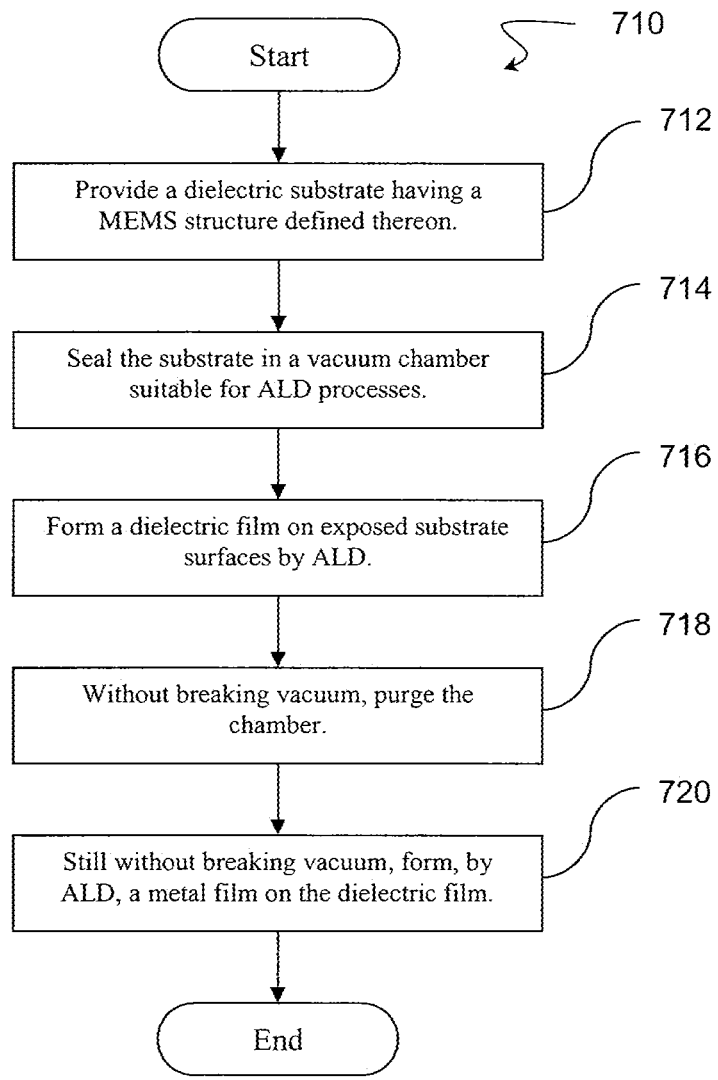
FIG. 7 illustrates an exemplary method for forming a bilayer conductive coating on a MEMS structure.

FIG. 7 is a flowchart of a method 710 of forming an ultra-thin, highly conformal and highly conductive bilayer dielectric/metal coating. In operation 712, a dielectric substrate having at least one resonant structure defined thereon is provided. The dielectric substrate could be, for example, quartz, fused quartz, fused silica, or any other dielectric having desired properties.

In operation 714 the dielectric substrate is sealed in a vacuum chamber suitable for Atomic Layer Deposition (ALD) processes. In operation 716, an ALD dielectric film is formed on exposed substrate surfaces. The ALD dielectric film can be an ALD $Al_2O_3$ (aluminum oxide) amorphous film formed using trimethylaluminum as a first precursor and water vapor gasses as a second precursor for the Atomic Layer Deposition. ALD $Al_2O_3$ amorphous films are known to exhibit a reactive chemistry which can serve as an adhesion layer or seed layer for other ALD layers. Reports in the literature have shown that $Al_2O_3$/ZnO (aluminum oxide/zinc oxide) composite ALD coatings can be used to prevent charging in the dielectric layer of RF MEMS switch devices. These films have resistivities in the $10^{13}$ to $10^{16}$ Ω-cm range. However, the use of $Al_2O_3$/metal ALD composite films is heretofore unknown for producing highly conductive and high Q coatings for metal electrodes on MEMS structures.

Typically, for $Al_2O_3$ amorphous films, in operation 714, the substrate is heated to the range of 180° C. to 220° C. and preferably to 200° C. while the background pressure in the chamber is preferably brought to the $10^{-2}$ Torr range before deposition begins. In one embodiment, a 15 millisecond pulse of deionized water vapor is released into a nitrogen ($N_2$) carrier gas stream flowing over the substrate. The chamber is then pumped for approximately eight seconds to return to a pressure of about $10^{-1}$ Torr with a continuous flow of $N_2$ at 20 Standard Cubic Centimeters per Minute (sccm). Then the precursor Trimethylaluminum (TMA) is introduced the same way. The reactant trimethylaluminum and water vapor gasses are introduced into the chamber sequentially, in pulses of about 10-15 milliseconds duration each and at an operating pressure of approximately 0.1 to 1 Torr, each being released into the same carrier gas stream, with the chamber being pumped for approximately eight seconds to bring it to a pressure of less than 1 Torr between the 10-15 millisecond between releases of trimethylaluminum and deionized water vapor into the carrier gas. The carrier gas is preferably $N_2$, but other carrier gases may be used, such as argon (Ar), if desired. The trimethylaluminum can be carried into the chamber using an Ar or $N_2$ flow with the total gas flow rate of approximately 20 sccm.

The deposition rate is nominally 1.1 angstroms per sequence (or cycle). A typical deposition run for a quartz DRG would consist of ten cycles, leading to the deposition of 11 angstroms (1.1 nm) of conformal $Al_2O_3$.

It should be understood that these process parameters can be varied to obtain desired results.

Next, in step 718, without breaking the vacuum, the chamber is purged. Then, in operation 720, still without breaking the vacuum, an ALD metal film is formed on the ALD dielectric film. As will be understood, the ALD metal film can be formed to any thickness desired by varying the number of monolayers deposited on the substrate. Preferably, the metal is a pure noble metal, such as, for example, rhodium (Rh), platinum (Pt), ruthenium (Ru), rhenium (Re), palladium (Pd), or iridium (Ir), and the oxidant (second precursor) is $O_2$. For rhodium, the first precursor can be rhodium (III) acetylacetonate. For platinum, the first precursor is preferably trimethyl (methylcylopentadienyl) platinum (($CH_3)_3(CH_3C_5H_4$)Pt).

The ALD process parameters for depositing an ALD platinum metal film in operation 720 are preferably as follows:

1. Establish a substrate temperature of approximately 270° C.
2. Release a 1 second pulse (approximately) of oxygen ($O_2$) into a nitrogen ($N_2$) carrier gas stream flowing over the substrate.
3. Pump the chamber for 1 second (approximately) to a pressure of less than 1 Torr.
4. Release a 0.25 second pulse of Trimethyl(methylcyclopentadienyl)platinum (($CH_3)_3$ ($CH_3C_5H_4$)Pt) into the same carrier gas stream, while maintaining the target substrate at approximately 270° C.
5. Pump the sample and chamber for 1 second to a pressure of less than 1 Torr.
6. Repeat steps 1 through 5 until the required number of cycles is completed.

The deposition rate is nominally 0.04 nm per cycle in operation 720. A typical deposition run for a quartz DRG would consist of 250 cycles, leading to the deposition of 10 nm of conformal Pt.

The monolayer deposition process yields coatings that are both ultra-thin and highly uniform, even on high-aspect ratio (>10:1) structures. Thus, damping, due to coating thickness, is minimized, and stress gradients over temperature, introduced by non-uniform coatings, are reduced.

The actual measured resistivities (ρ) of ALD metal films formed by the process described in operation 720 are near bulk metal resistivity values of $10^{-5}$ to $10^{-6}$ Ω-cm, as shown below, which provides for highly conductive coatings and thus excellent electrical performance characteristics.

Measured resistivity of ALD metal films of the present invention:

ρ=9.1×$10^{-6}$ Ω-cm for 50 nm thick Pt (bulk value 9.8×$10^{-6}$ Ω-cm); and

ρ=2.0×$10^{-5}$ Ω-cm for 30 nm thick Ru (bulk value 1.0× $10^{-5}$ Ω-cm).

Additionally, an ALD $Al_2O_3$ amorphous film beneath an ALD metal film actually increases a resonator's Q compared to coating that resonator with an ALD metal film alone. This is due to the reduction of surface interfacial slippage and the surface passivation that the ALD $Al_2O_3$ amorphous film provides. For example, disc resonators, to be described in detail below, having bilayer ALD $Al_2O_3$/Pt or $Al_2O_3$/Ru coatings formed according to the method of FIG. 7 have shown to have performance gains of 20% over comparable disc resonators having only Pt or Ru coatings, respectively.

Alternate Metal High Q Coating and Method

In an alternate method for forming an ultra-thin, highly conformal and highly conductive coating, though not shown in detail in the Figures, an ALD metal film is deposited directly on a dielectric substrate having at least a MEMS structure defined thereon. That is, in this alternate method, the ALD dielectric film is not utilized. Rather, the High Q coating consists of only an ALD metal film. As above, the dielectric substrate could be, for example, quartz, fused quartz, fused silica, or any other dielectric having desired properties. And, the MEMS structure could be a resonator. Also, preferably the metal is a noble metal. The same ALD process parameters and precursors discussed above in relation to step 720 of FIG. 7 can be used in this alternate method. For the same reasons as above, the resulting conductive coatings are highly conformal, have a highly uniform thickness, and have resistivities approaching that of bulk metal values. It will be appreciated that this alternate metal coating and method can be utilized whenever desired.

It should be understood that formed bilevel High Q coatings or alternative metal High Q coatings can be etched, patterned, or otherwise processed as desired and/or necessary in certain applications.

These methods for forming High Q coatings, disclosed above, will now be further discussed in regard to fabricating an all-quartz disc resonator gyroscope. However, the present disclosure is applicable to any crystalline or amorphous dielectric MEMS structure design, geometry, or architecture where ultra-thin, highly conformal and highly conductive coatings are desired, including, for example, shear mode piezoelectric resonators having any desired fundamental mode resonance, including those in excess of 100 MHz. Further, a resonator fabricated in accordance with these methods may be utilized as any desired component in a MEMS device, including oscillators and filters.

Disc Resonator Gyroscope (DRG) Architecture

Figure 1A:
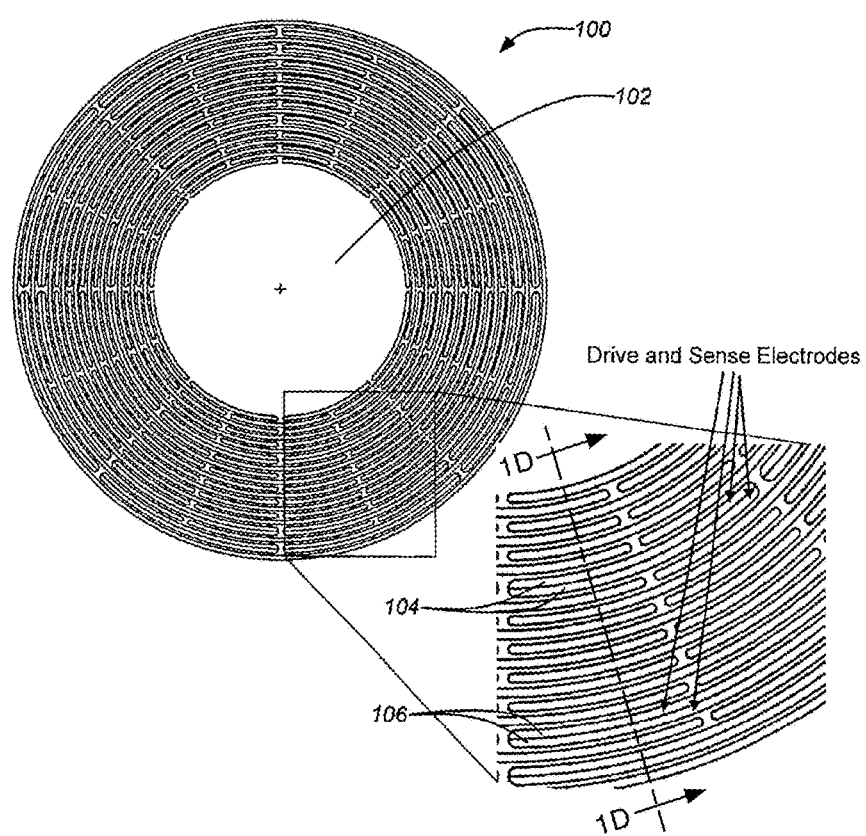
FIG. 1A shows a typical disc resonator architecture for an all-quartz resonator gyroscope.

FIG. 1A shows a typical disc resonator 100 architecture for an all-quartz resonator gyroscope. A typical embodiment comprises a gyroscope including a planar disc resonator 100 fabricated of fused quartz in which deep reactive ion etching may be used to slot the disc into a system of interconnected rings 103 supported at a central support 102 with internal drive and sense electrodes 104, 106. The rings 103 and drive/sense electrodes 104, 106 are separated by gaps 101 over a substantial portion of the circumference. The internal drive and sense electrodes 104, 106 are formed from the quartz material left in the circumferential slots of the disc resonator 100. The drive and sense electrodes 104, 106 are electrostatic and may operate in paired halves within a single slot, e.g. an inner half and outer half divided along the length of the slot. Thus, the drive and sense electrodes 104, 106 generally interact with the disc resonator in the plane of the disc across narrow gaps 101 between the electrodes 104, 106 and the disc structure. Location of the drive and sense electrodes 104, 106 can be varied, however, it is desirable to position the sense electrodes 106 towards the outside edge of the disc resonator 100 to enhance sensitivity. Electrical connections to the drive and sense electrodes 104, 106 can be achieved through an etched metallic layer deposited on the etched quartz baseplate as described hereafter. Additional bias (or trim) electrodes may also be employed to assist in tuning the resonator and improving overall performance. The bias electrodes are incorporated into the structure along with the drive and sense electrodes and are used for tuning the frequency of the modes electrostatically for optimal performance.

Figure 1B:
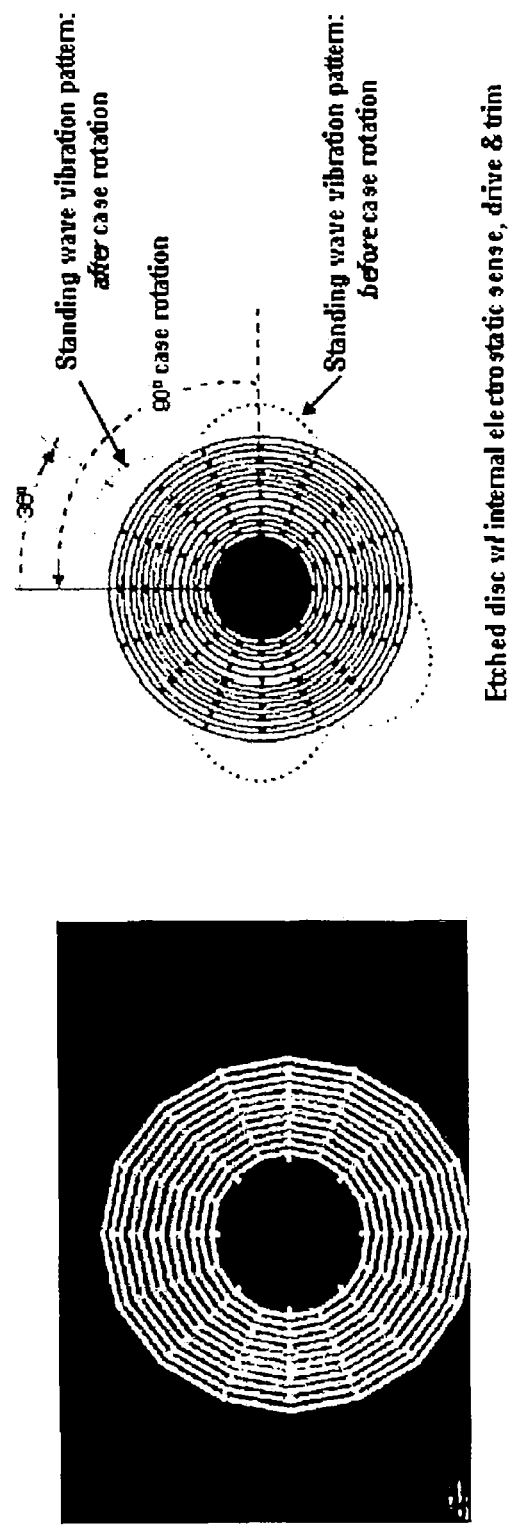
FIG. 1B depicts the operation of a disc resonator for an all-quartz resonator gyroscope.
Figure 1C:
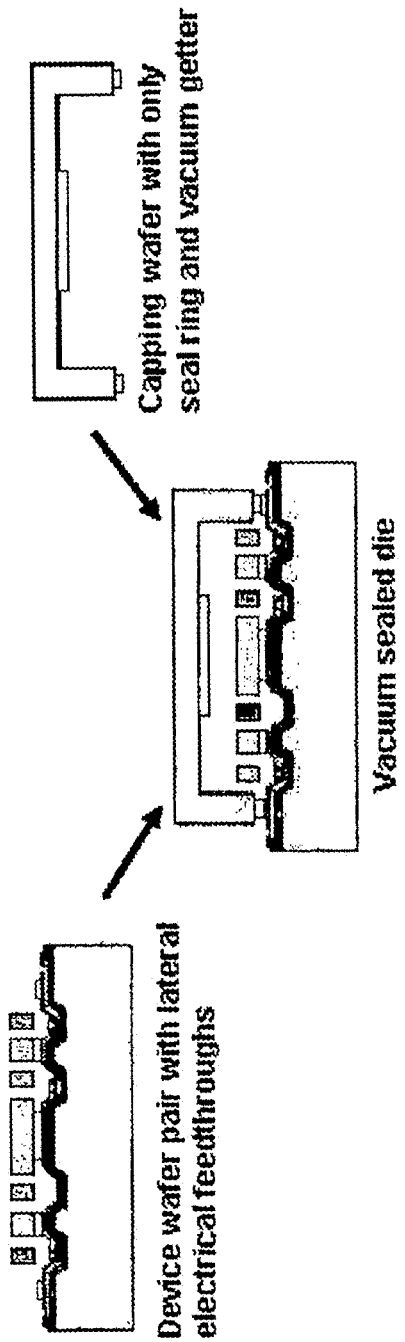
FIG. 1C illustrates the configuration of an all-quartz disc resonator gyroscope including vacuum sealing.
Figure 1D:
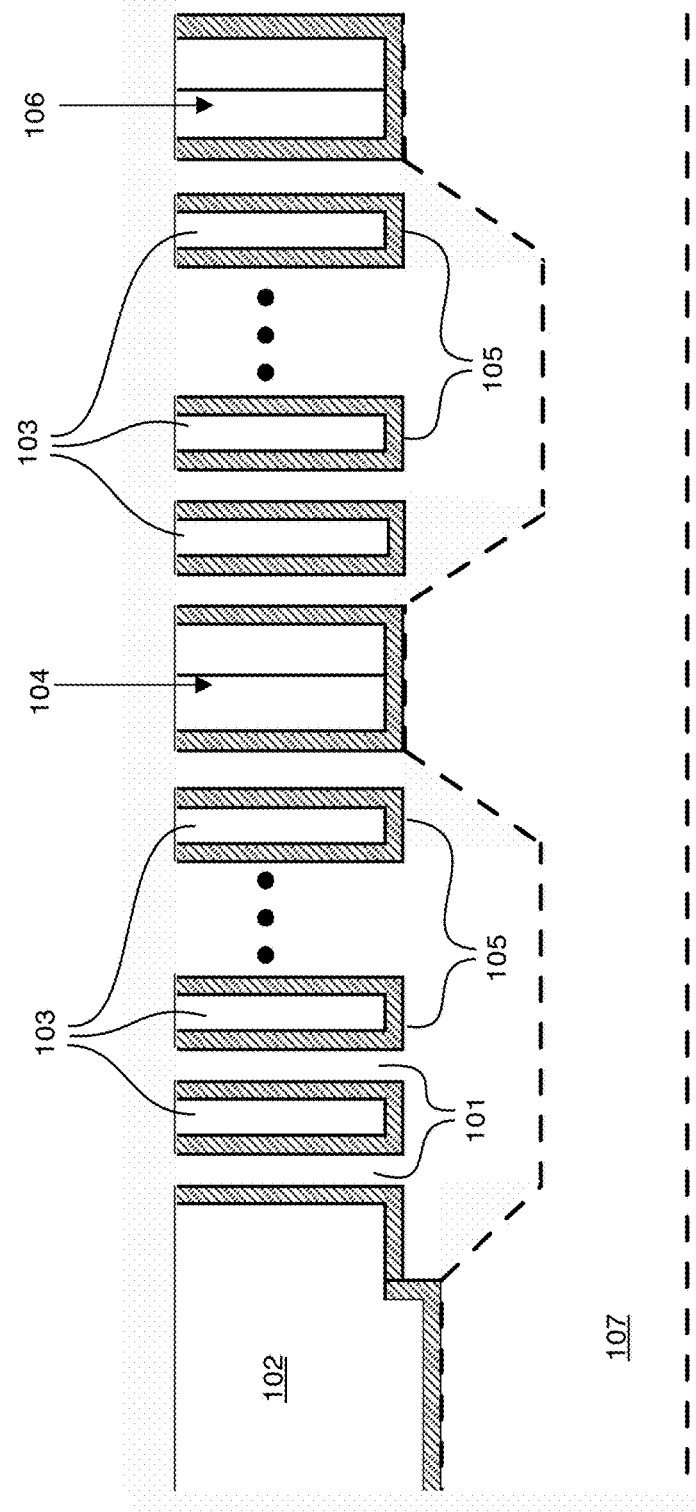
FIG. 1D is a cross sectional view of the resonator in FIG. 1A along the line 1D-1D.

FIG. 1D is a cross section taken along line 1D-1D of FIG. 1A which is along a radial line of the resonator 100 illustrating the ALD coating 105 on the resonator 100. The basically concentric rings 103 are separated from each other and the drive and sense electrodes 104, 106 by gaps 101. If the resonator 100 were illuminated from below, light would be visible through the gaps 101. These gaps 101 have an aspect ratio of their own in the range from 10:1 to 3:1 of height to width. The ALD process is ideally suited for applying a metal coating between 10 and 100 nm thick on the rings 103 and drive and sense electrodes 104, 106. As shown in FIG. 1D, the ALD coating 105 coats three sides of the electrodes 104, 106, rings 103 and central support 102. Both the central support 102 and the drive and sense electrodes 104, 106 may be supported at high spots on an etched quartz baseplate 107. The actual support for the rings 103 are not visible in FIG. 1D. A section along a different radius would show the rings 103 connect to the central support 102 through a serpentine path of ring 103 material.

FIG. 1B illustrates the operation of a disc resonator for an all-quartz resonator gyroscope. The left panel illustrates an analytical model of a typical disc resonator. The right panel depicts a DRG. In operation, the disc resonator 100 is excited such that a standing wave vibration pattern (which may be likened to the "wine glass" mode of the known hemispherical resonator gyroscope) moves in response to rotation of the gyroscope case as shown in the right image. Coriolis forces couple two degenerate modes of the disc to yield a new standing wave pattern after rotation of the DRG. In the example shown, under a case rotation (i.e. rotation of the entire DRG) of 90 degrees, the standing wave pattern shifts approximately 60 degrees (90 degrees less a 30 degree shift). The disc resonator architecture may comprise an axisymmetric resonator supported at a central node. A large number of circumferential slots occupied by the drive and sense electrodes 104, 106 provide a large area for capacitive electrode actuation and sensing, yielding a large signal to noise (S/N) ratio. The architecture lends itself to a simple two dimensional design, homogeneous material and batch fabrication and inexpensive manufacturing.

FIG. 1C illustrates the overall configuration of an all-quartz disc resonator gyroscope including vacuum sealing which will be detailed hereafter. The all quartz construction of the disc resonator, baseplate wafer, and cap wafer provides a design with low temperature sensitivity. The handle wafer employed in manufacturing helps minimize debris, shorting and footing issues. An Au to Au thermo-compression bond may be employed for resonator attachment to the baseplate using ~3 μm accuracy for the critical bonding step. In addition, device wafer pair fabrication can be fully decoupled from vacuum sealing to enable early wafer-level vacuum testing of the gyroscope.

U.S. Pat. No. 6,915,215 to McCloskey et al., which is incorporated by reference herein, describes exemplary control architectures for DRG embodiments described herein such as the all-quartz disc resonator gyroscope. Control of a DRG can be accomplished through the use of bulk complementary metal oxide semiconductor (CMOS) low power digital control circuit (e.g., an application specific integrated circuit [ASIC]) and/or a silicon-on-insulator (SOI) CMOS analog interface in the exemplary circuit designs described therein.

Prior art post resonator gyroscopes operate using rocking modes of a post fixed to a planar electrostatically driven and sensed plate. One example is described in U.S. Pat. No. 5,894,090 to Tang et al., which is incorporated by reference herein.

All-Quartz Disc Resonator Gyroscope and Manufacturing Process

Four fused quartz wafers may be used to form the vacuum-sealed disc resonator gyroscope (DRG). One quartz wafer can serve as a temporary handle for the quartz resonator wafer processing of another quartz wafer. The two remaining quartz wafers can be used as a vacuum cap and an electrical baseplate, respectively. It should be noted that in description hereafter exemplary embodiments are illustrated through a two-dimensional side view cross sections showing the processes for developing the basic electrical and structural elements involved. Those skilled in the art will understand application of those processes to the exemplary disc resonator architecture of FIG. 1A or other MEMS structures.

Figure 2A:
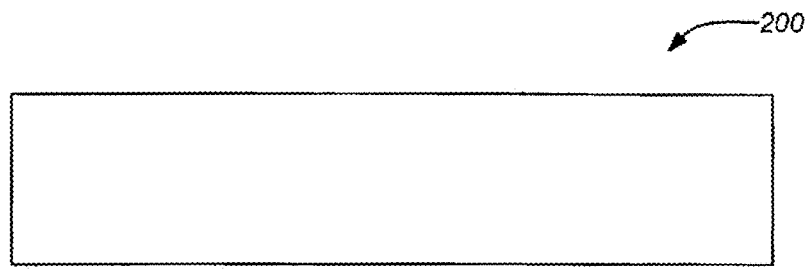
FIGS. 2A-2F illustrate a manufacturing process of a baseplate wafer for an all-quartz resonator gyroscope.
Figure 2B:
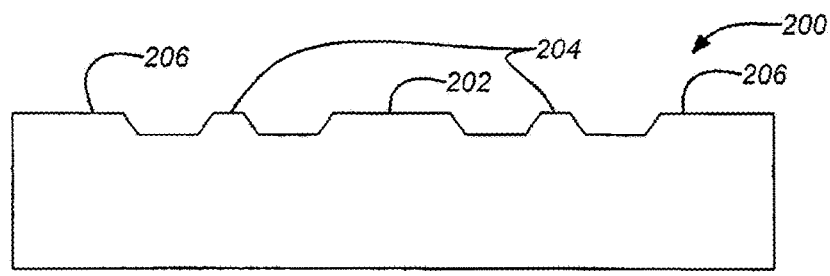
Figure 2C:
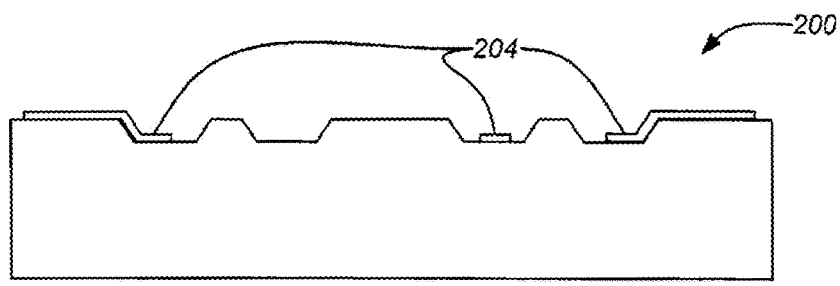
Figure 2D:
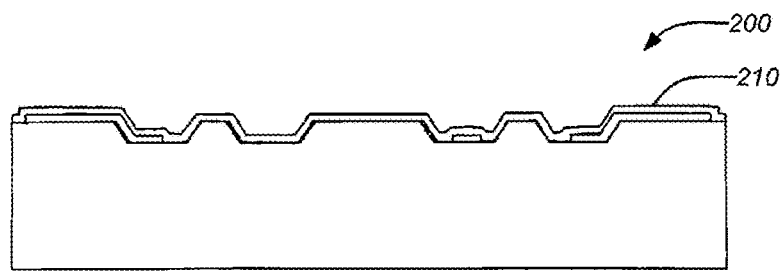
Figure 2E:
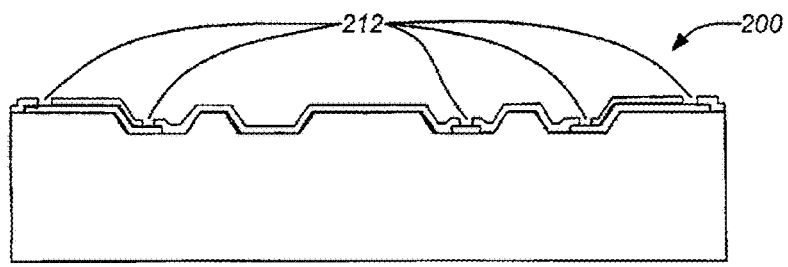
Figure 2F:
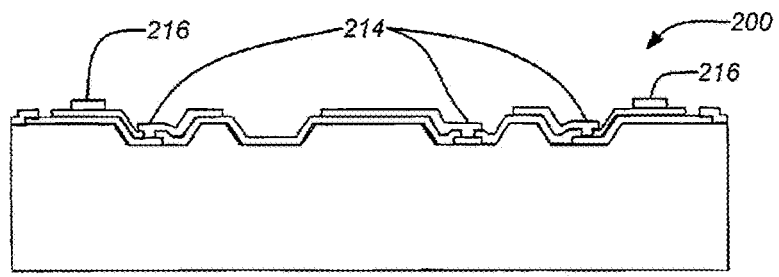

FIGS. 2A-2F illustrate a manufacturing process of a complete baseplate wafer for use in an all-quartz resonator gyroscope in sequence. The quartz baseplate wafer fabrication begins with a recess etch of the fused quartz wafer 200 as shown in FIG. 2B using either a fluorine-chemistry plasma or hydrofluoric acid process or any other known process capable of etching quartz to yield the appropriate pattern (e.g. matching the planar resonator layout of FIG. 1A) of recesses leaving high spots for the central support location 202 of the planar resonator and to provide contacts for the electrode locations 204 as well as the DRG case wall location 206 (for the cap wafer detailed hereafter). The etched recesses provide areas in which electrical circuit interconnects can be deposited to appropriately connect the drive and sense electrodes to the control circuitry. Following the etching, Ti/Au or Cr/Au (200 A/5000 A) are metallized on the wafer 200 to form the interconnects 208 for the electrodes as shown in FIG. 2C. A plasma enhanced chemical vapor deposition (PECVD) silicon dioxide or silicon nitride (5000 Å) is then deposited to form the inter-metal dielectric layer 210 as shown in FIG. 2D. Reactive ion etching (RIE) may then be used to open vias 212 through the inter-metal dielectric layer 210 as shown in FIG. 2E. A second metallization of Ti/Au or Cr/Au (200 Å/5000 Å) may be used to deposit the metal bond pads 214 and a vacuum seal ring 216 as shown in FIG. 2F. This concludes the baseplate wafer 200 fabrication.

Figure 2G:
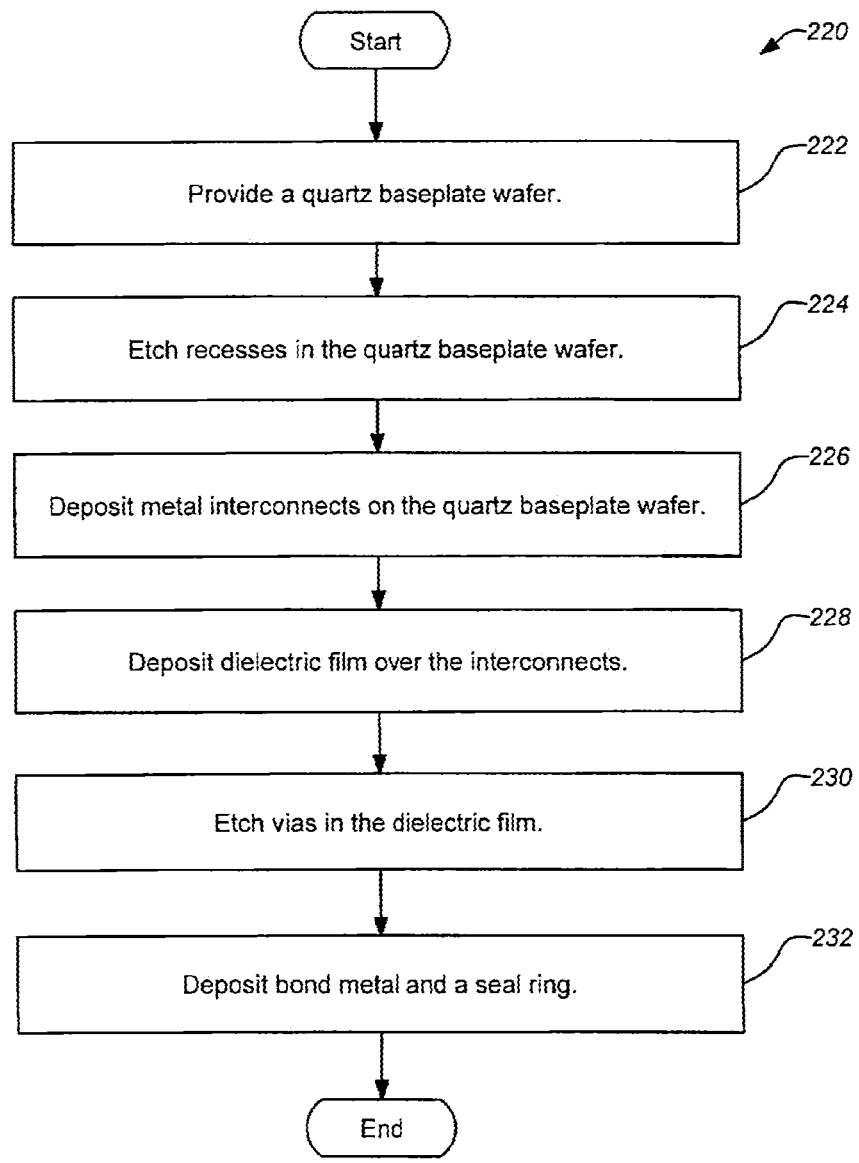
FIG. 2G is a flowchart of an exemplary method of manufacturing a baseplate wafer for an all-quartz resonator gyroscope.

FIG. 2G is a flowchart of an exemplary method 220 of manufacturing a baseplate wafer for an all-quartz resonator gyroscope. In operation 222, a first fused quartz wafer is provided for a baseplate as shown in FIG. 2A. In operation 224, recesses are etched in the fused quartz baseplate as shown in FIG. 2B. In operation 226, metal interconnects are deposited on the fused quartz baseplate as shown in FIG. 2C. In operation 228, dielectric film is deposited over the interconnects as shown in FIG. 2D. In operation 230, vias are etched in the dielectric film as shown in FIG. 2E. And in operation 232, bond metal and a seal ring are deposited as shown in FIG. 2F. The seal ring marks out the periphery of the disc resonator and the bond metal is used to mount the disc resonator at the central support and the electrodes throughout the interior of the disc.

Figure 3A:
FIGS. 3A-3H illustrate a manufacturing process of a resonator wafer for an all-quartz resonator gyroscope.
Figure 3B:
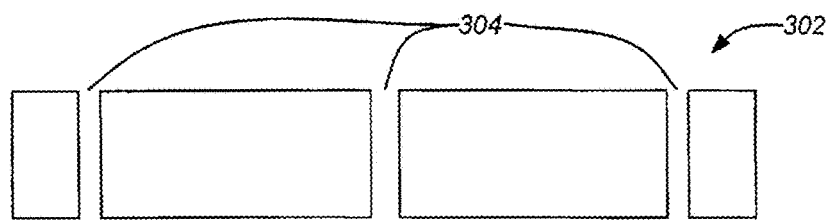
Figure 3C:
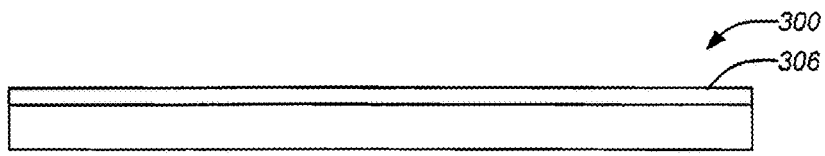
Figure 3D:
Figure 3E:
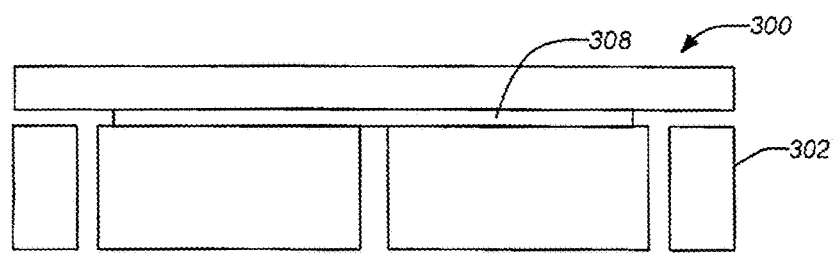

FIGS. 3A-3G illustrate a manufacturing process of a resonator wafer for an all-quartz resonator gyroscope, in sequence. The starting materials for the resonator wafer process are a full fused quartz resonator wafer 300 (FIG. 3A) and another fused quartz wafer to be used as a handle wafer 302 (FIG. 3B) having release holes 304 (which may be ultrasonically machined through it). A silicon thin film 306 (approximately 1 μm) is deposited on the resonator wafer 300 using a plasma enhanced chemical vapor deposition (PECVD) as shown in FIG. 3C or using SOI technology as will be understood by those skilled in the art. A chemical mechanical planarization (CMP) step may be carried out if there are any unacceptable surface imperfections due to the deposition. The silicon film may then be patterned 308 using a fluorine chemistry RIE as shown in FIG. 3D in regions that are not required for later bonding the etched resonator to the baseplate wafer. This will speed the final release step. In general, depending upon the applied resonator architecture the pattern will provide enough bonding area in the appropriate locations so that the resonator wafer 300 is stable on the handle wafer 302, but allowing relatively easy release of the handle wafer 302 in later processing. The resonator wafer 300 with patterned silicon film 308 is then bonded to the handle wafer 302 with through holes as shown in FIG. 3E.

Figure 3F:
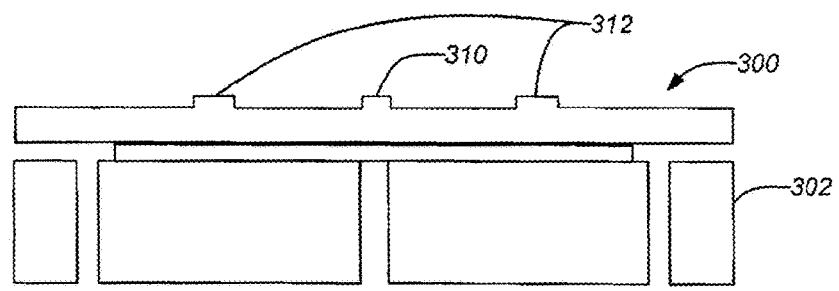

FIG. 3F illustrates an optional process of additional etching of the bottom of the disc resonator wafer 300 as shown. This may be done to form raised areas for the central support location 310 and electrode locations 312 where the baseplate wafer 200 will be bonded in subsequent processing.

Figure 3G:
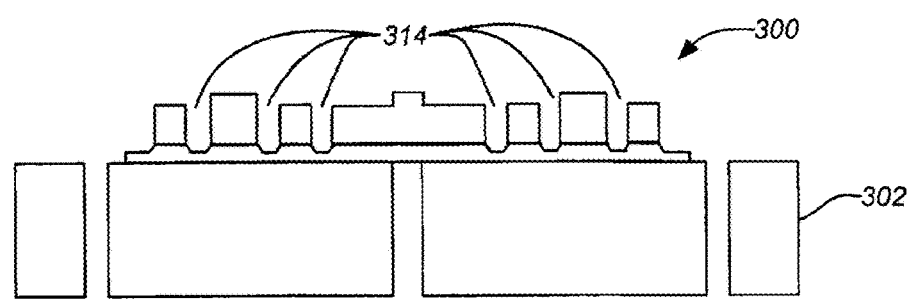
Figure 3H:
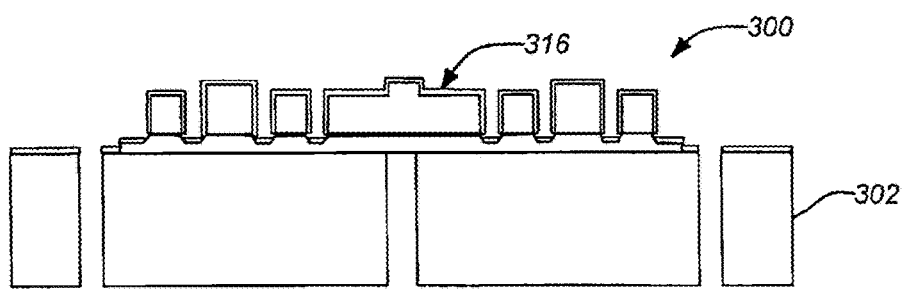

FIG. 3G then illustrates deep reactive ion etching (DRIE) that may be used to define the resonator pattern (e.g. the pattern shown in FIG. 1A) including the electrodes and central support with straight side walls 314 completely through the resonator wafer 300. DRIE of fused quartz defines resonator with straight side walls and minimal surface roughness. Note that the electrodes are now embedded within the resonator wafer 300 but physically disconnected from the resonator structure. Thus, the handle wafer 302 now supports the pattern of resonator structure and electrodes in the resonator wafer 300.

Figure 8:
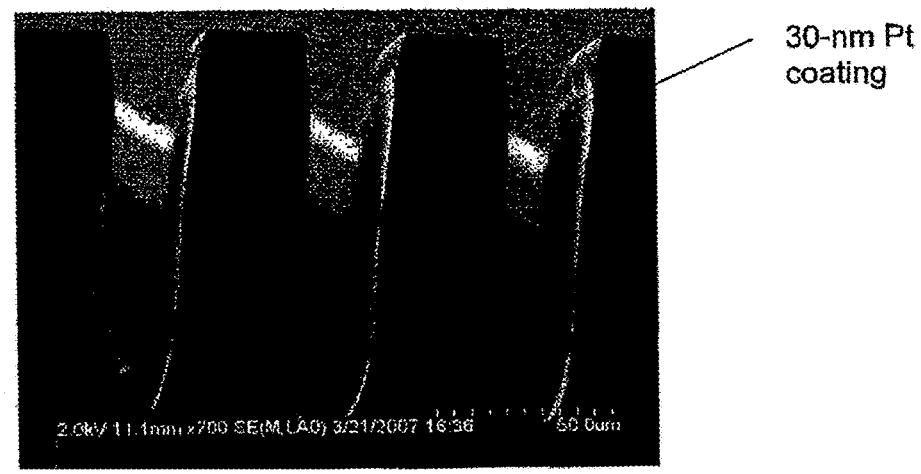
FIG. 8 is a scanning electronic microscope image of a high-aspect-ratio resonator having a conductive coating formed thereon according to one aspect of the invention.

The bonding surface of the resonator and the sidewalls are then metallized 316 with either the bilayer High Q coating or the alternate metal High Q coating, each discussed above. Both provide highly conformal and highly uniform coatings on the atomic scale. Thus, the thickness of a conductive coating can be reduced to a minimum while maintaining a continuous coating in high aspect ratio structures, including those having an aspect ratio in excess of 5:1. For example, FIG. 8 is a scanning electron microscope image 800 of the etched disc resonator wafer 300 having a 30 nm thick platinum coating formed directly thereon in accordance with the alternate metal High Q method described above.

Figure 3I:
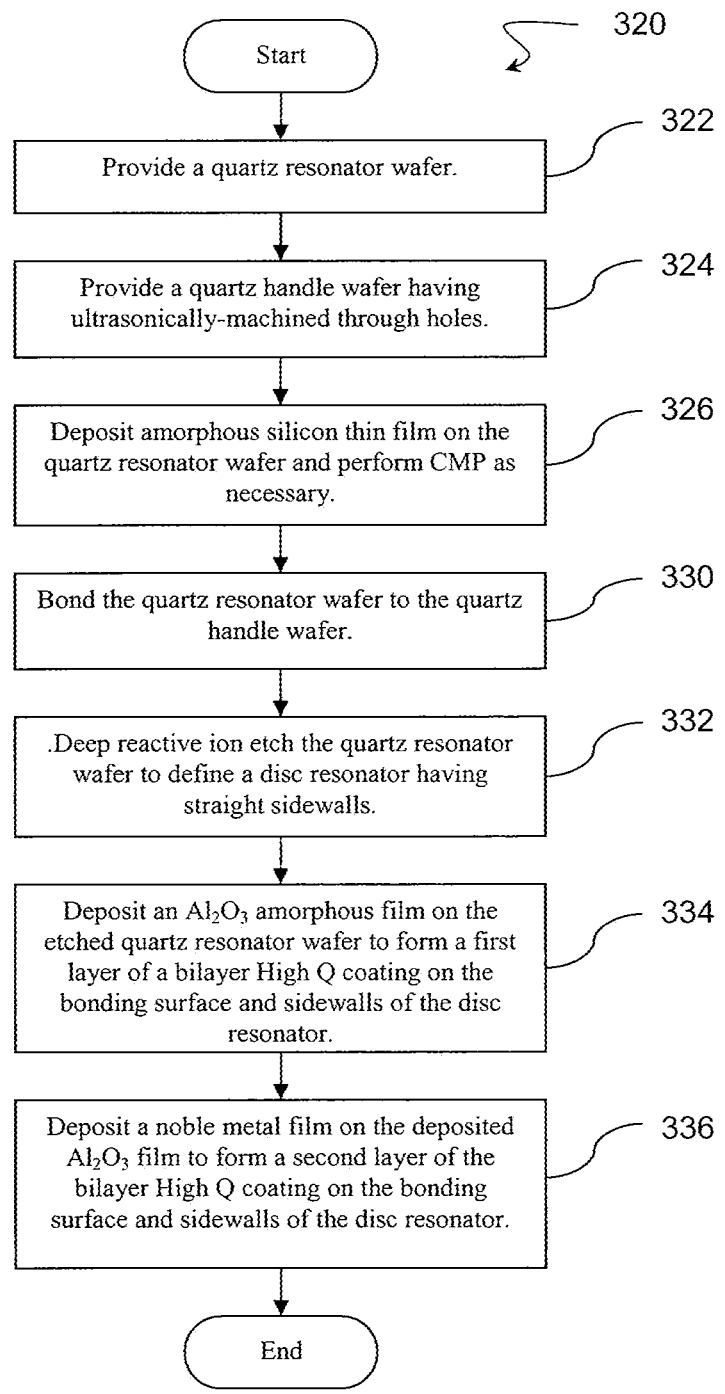
FIG. 3I is a flowchart of an exemplary method of manufacturing a resonator wafer for an all-quartz resonator gyroscope.

FIG. 3I is a flowchart of a method 320 of manufacturing a resonator wafer for an all-quartz resonator gyroscope, including the bilayer High Q coating. In operation 322, a second fused quartz wafer is received for the disc resonator as shown in FIG. 3A. In operation 324, a third fused quartz wafer is received for a handle with ultrasonically machined or laser machined through holes as shown in FIG. 3B. In operation 326, amorphous silicon thin film is deposited on the second wafer with chemical mechanical planarization (CMP) performed as necessary as shown in FIG. 3C. In operation 328, silicon is patterned on the second wafer as shown in FIG. 3D. In operation 330, the second wafer is bonded to the third wafer as shown in FIG. 3E. The wafers may be bonded with plasma-assisted room temperature bonding. Though not shown in FIG. 3I, an optional process of additional etching of the bottom of the disc resonator wafer for electrode and support contacts as shown in FIG. 3F, can be performed subsequent to operation 330 and before operation 332.

In operation 332, the second wafer is deep reactive ion etched (DRIE) to define the disc resonator with straight side walls as shown in FIG. 3G. The sidewalls define gaps 101 between rings 103 or drive/sensor electrodes 104/106 with a height-to-width aspect ratio between 3:1 and 10:1. In operation 334, an $Al_2O_3$ amorphous film is deposited on the etched quartz resonator wafer by Atomic Layer Deposition, as discussed above and shown in FIG. 7, to form the first layer of the bilayer High Q coating on the bonding surface and sidewalls of the disc resonator. Preferably, the deposited $Al_2O_3$ amorphous film is 1 to 2 nm-thick. In operation 336, a noble metal film is deposited on the $Al_2O_3$ amorphous film, also as discussed above and shown in FIG. 7, to form the second layer of the bilayer High Q coating on the bonding surface and sidewalls of the disc resonator. Preferably, the deposited noble metal film is 1 to 20 nm thick. Together, the ALD $Al_2O_3$ amorphous film and the ALD metal film form a bilayer High Q coating that is ultra-thin, highly conformal, and highly conductive, as discussed above.

Figure 4A:
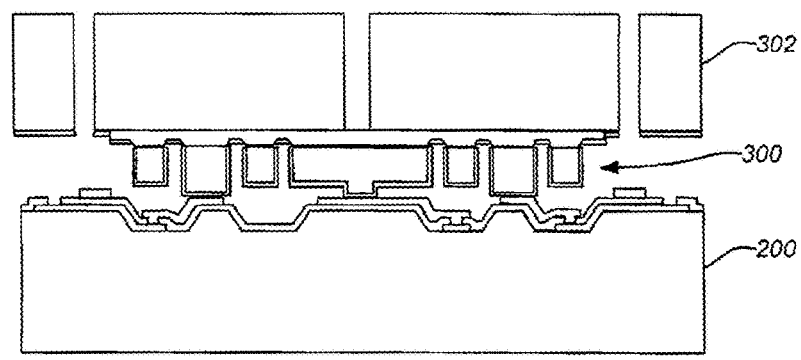
FIGS. 4A-4C illustrate an assembly process of a resonator wafer and baseplate wafer for an all-quartz resonator gyroscope.
Figure 4B:
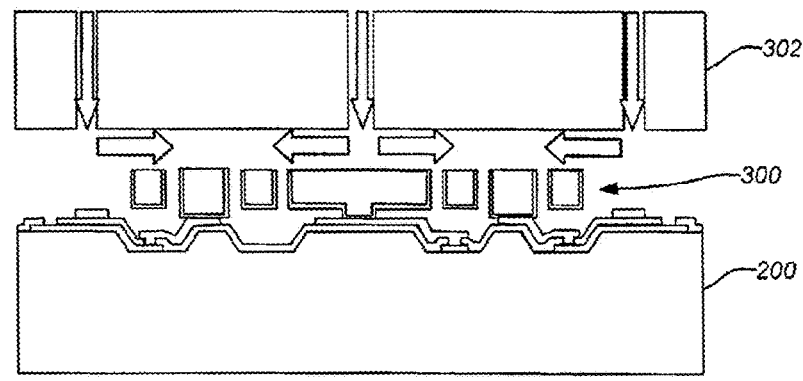

FIGS. 4A-4B illustrate assembly of a resonator wafer and baseplate wafer for an all-quartz resonator gyroscope. The resonator wafer 300 and handle wafer 302 pair are then brought in contact and aligned with the baseplate wafer 200. The resonator wafer 300 and baseplate wafer 200 may be bonded together using a metal/metal thermal compression bond, to bond the metal bond pads 214 of the baseplate wafer 200 to the central support location 310 and the electrode locations 312 of the resonator wafer 300 as shown in FIG. 4A. Alignment can be performed through the transparent baseplate wafer for .about. 0.5 μm accuracy. These bonds form the electrical connections to the electrodes and resonator structure. To release the resonator structure from the handle wafer, Xenon Difluoride gas (shown by arrows in FIG. 4B) may be passed through the release holes of the handle wafer to undercut the silicon layer complete the transfer of the resonator wafer 300 from the handle wafer 302 to the baseplate 200. The top side of the resonator wafer may then be coated with thin metallic layer 400 (e.g., approximately 10-20 nm thick) Al or Au with angled evaporation to form a completely symmetric structure and prevent shorting of probe pads.

Figure 4C:
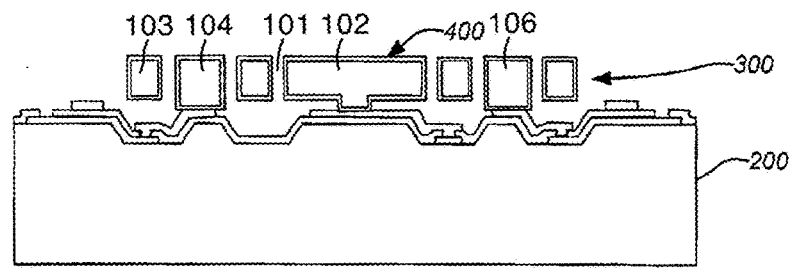

The final structure is illustrated in FIG. 4C.

Figure 4D:
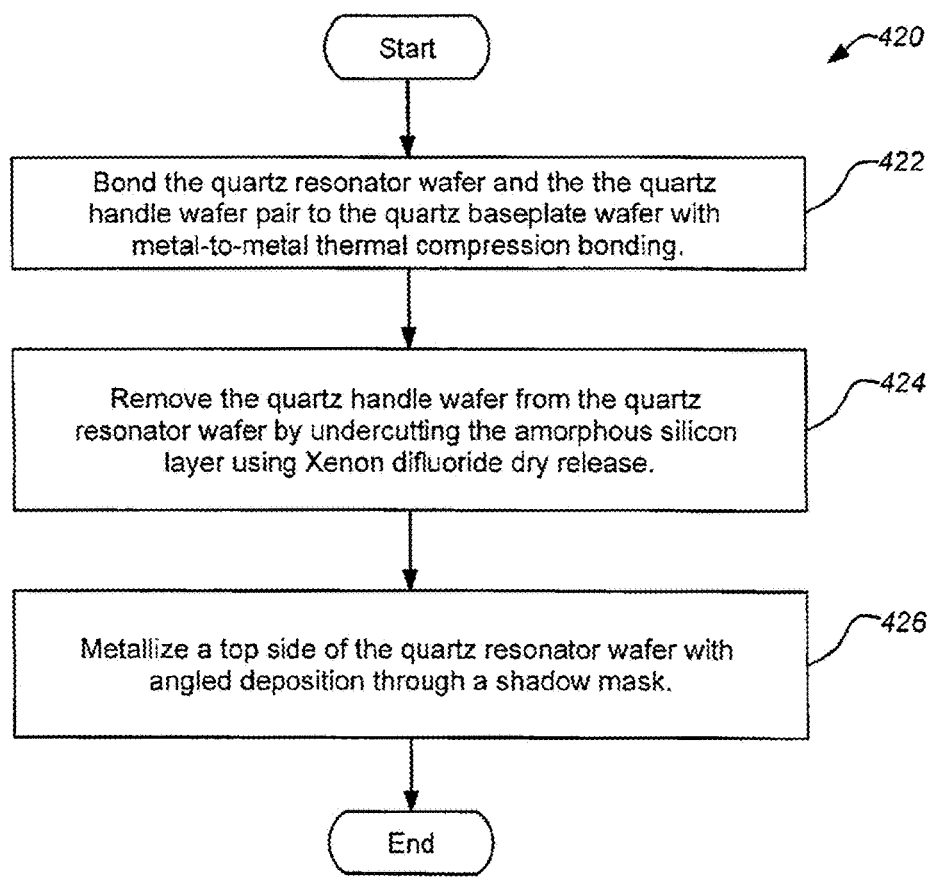
FIG. 4D is a flowchart of an exemplary method of assembling a resonator wafer and baseplate wafer for an all-quartz resonator gyroscope.

FIG. 4D is a flowchart of a method 420 of assembling a resonator wafer and baseplate wafer for an all-quartz resonator gyroscope. In operation 422, the second and the third wafer pair are bonded to the first wafer with metal-to-metal thermal compression bonding as shown in FIG. 4A. Alignment of the second and third wafers may be performed through the transparent first wafer to achieve about 0.5 µm accuracy. In operation 424, the third wafer is removed from the second wafer by undercutting the silicon layer using Xenon Difluoride dry release as shown in FIG. 4B. The flow of Xenon Difluoride is indicated by the arrows. And in operation 426, the top side of the second wafer is metallized with angled deposition through a shadow mask to prevent shorting of probe pads as shown in FIG. 4C. Thus, the disc resonator is symmetrically coated with a thin conductive layer of metal to allow it to function electrostatically with the electrodes.

Figure 5A:
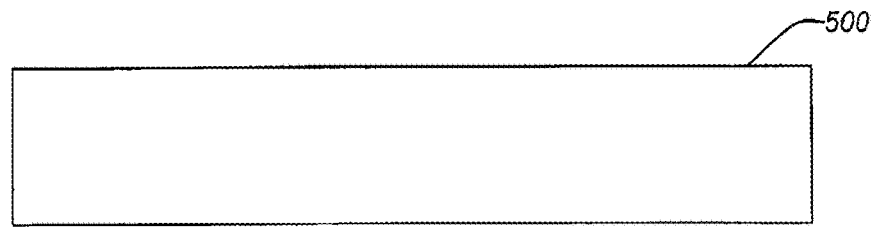
FIGS. 5A-5F illustrate a vacuum sealing process of a resonator wafer and baseplate wafer for an all-quartz resonator gyroscope.
Figure 5B:
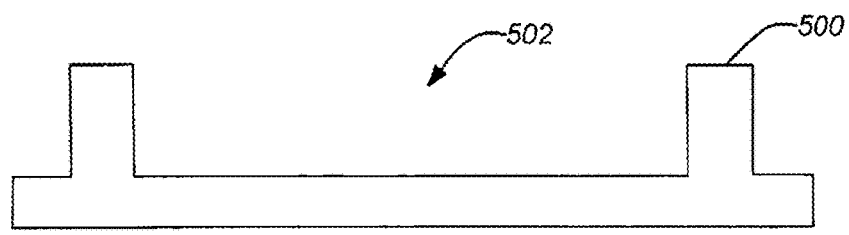
Figure 5C:
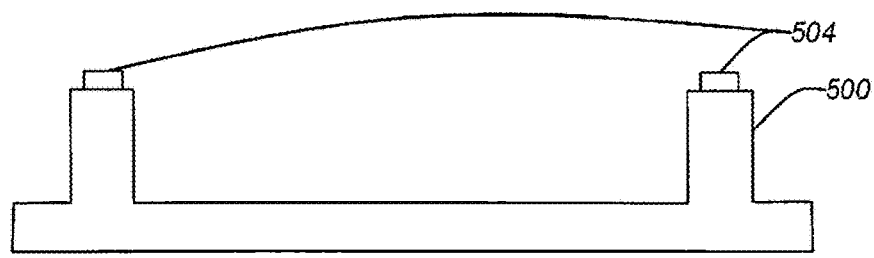
Figure 5D:
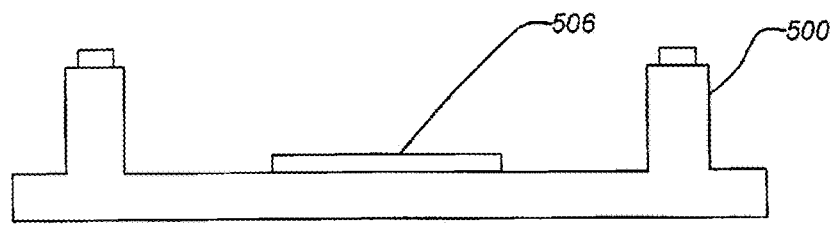
Figure 5E:
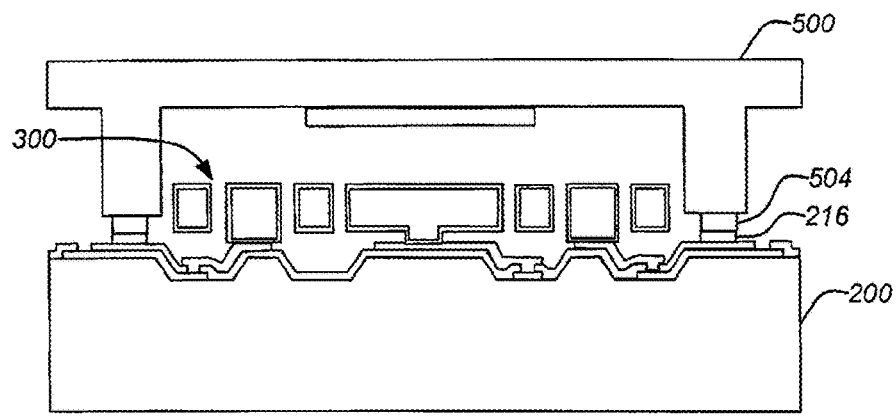
Figure 5F:
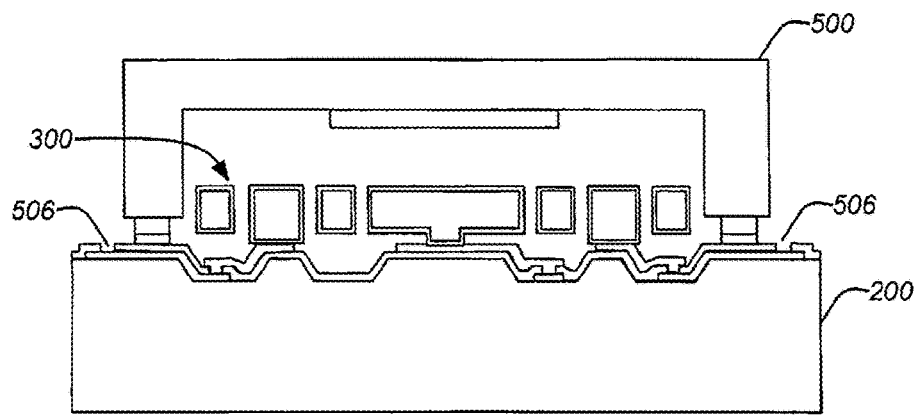

FIGS. 5A-5F illustrate a vacuum sealing process of a resonator wafer 300 and baseplate wafer 200 for an all-quartz resonator gyroscope. The vacuum sealing process begins with a cavity 502 etched into a fused quartz cap wafer 500, e.g. using ultrasonic machining as shown in FIG. 5B. Then indium or tin solder (~5 µm thick) may be deposited using spray coating lithograph) and lift-off to form a metal bond line 504 around the perimeter of the cavity 502 as shown in FIG. 5C. A vacuum getter 506 may then be deposited into the cavity using a shadow mask as shown in FIG. 5D. For example the vacuum getter may comprise a titanium-based thin film getter or any similar getter material compatible with the structure and processes defined herein. The cap wafer 500 is brought to the resonator wafer 300 and baseplate wafer 200 pair and aligned using a bond aligner known in the art. For example, a bond aligner system from Electronic Vision Group or other similar systems may be applied to properly bond the wafers previously aligned to one another. The cap wafer 500 may be temporarily kept in near separation from the resonator wafer 300 and baseplate wafer 200 pair with 50 µm thick spacers. This three-wafer stack is then transferred to a wafer bonder so that the cavity of the cap wafer 500 can be evacuated through the gap created by the 50 µm-thick spacers. Once vacuum is achieved inside the cavity, the vacuum getter may be heated to approximately 350° C. for activation. The 50 µm thick spacers may then be removed to contact the metal bond line 504 of the cap wafer 500 to the vacuum seal ring 216 of the baseplate wafer 200 to form the vacuum seal with the solder as shown in FIG. 5E. Note that the electrical interconnects to the resonator and electrodes pass under the vacuum seal. Finally, the cap wafer 500 may be ultrasonically machined to create access to the probe pads to the electrical interconnects of the gyroscope as shown in FIG. 5F.

Figure 5G:
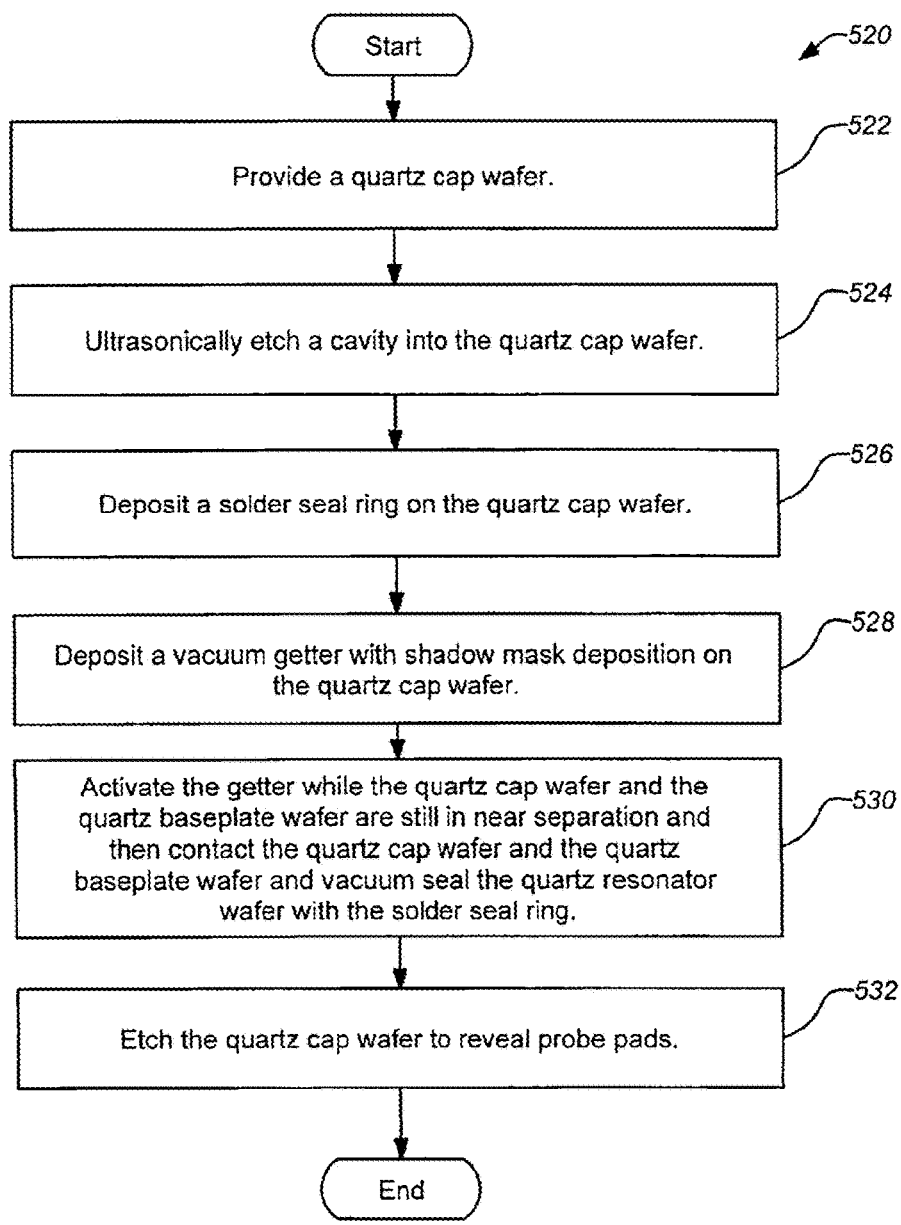
FIG. 5G is a flowchart of an exemplary method of vacuum sealing a resonator wafer and baseplate wafer for an all-quartz resonator gyroscope.

FIG. 5G is a flowchart of a vacuum sealing method 520 of a resonator wafer and baseplate wafer for an all-quartz resonator gyroscope. In operation 522, a fourth fused quartz wafer is provided for a cap wafer as shown in FIG. 5A. In operation 524, a cavity is ultrasonically etched into the cap wafer as shown in FIG. 5B. In operation 526, a solder seal ring is deposited with spray coating lithography and lifted-off as shown in FIG. 5C. In operation 528, a vacuum getter is deposited with shadow mask deposition as shown in FIG. 5O. In operation 530, the getter is activated while the cap wafer and the baseplate wafer are still separated and then the cap wafer and the baseplate wafer are contacted to vacuum seal the resonator wafer with the solder seal ring as shown in FIG. 5E. And in operation 532, the cap wafer is then etched to reveal probe pads as shown in FIG. 5F.

Figure 6A:
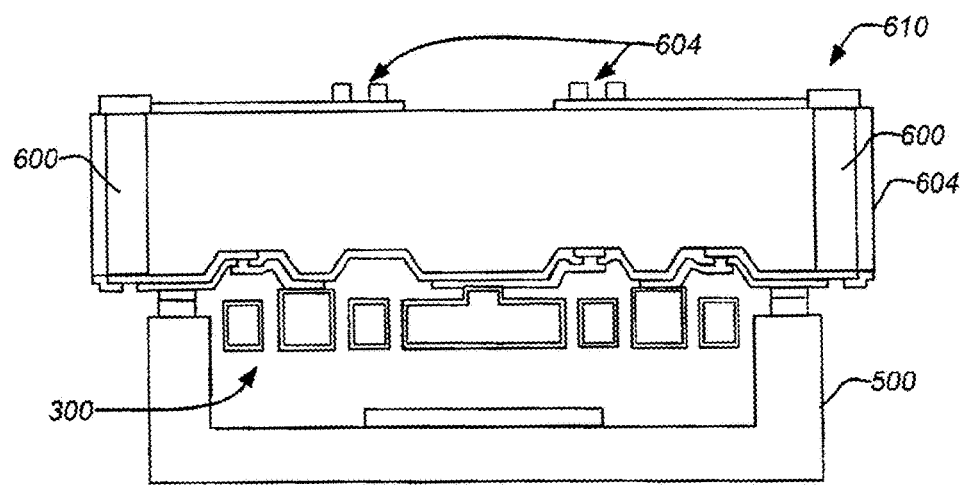
FIGS. 6A and 6B illustrate an embodiment of an all-quartz resonator gyroscope including integral control electronics.
Figure 6B:
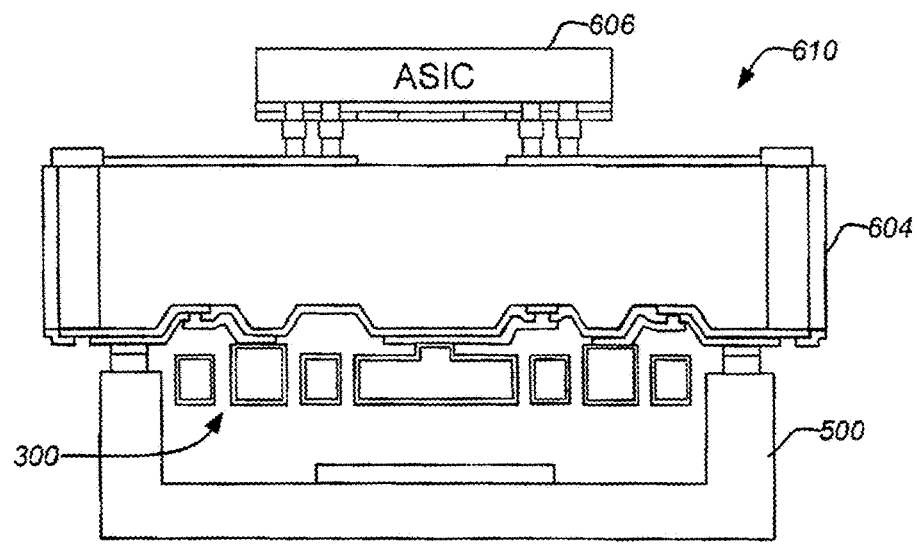

FIGS. 6A and 6B illustrate an embodiment of an all-quartz resonator gyroscope 610 including integral control electronics. In general, the gyroscope 610 is developed as described above with some additional processing. In FIG. 6A the all-quartz disc resonator gyroscope is vacuum sealed (consistent with the process outlined in FIGS. 5A-5G) with through wafer interconnects 600 and backside indium bond pads 602 integrated into the baseplate wafer 604. The baseplate wafer 604 may be produced just as the baseplate wafer 200 of FIGS. 2A-2G with the addition of the through wafer interconnects 600 being integrated into the baseplate wafer 604 prior to the metallization patterning on the wafer to form the interconnects for the electrodes as shown in FIG. 2C. In this case, the metallization is connected to the through wafer interconnects 600. Further metallization may be patterned on the backside of the baseplate wafer 604 from the through wafer interconnects 600 to the bond pads 602. In FIG. 6B control electronics 606 (e.g. an ASIC control electronics chip) may be flip-chip bonded to the all-quartz disc resonator gyroscope package with electrical connections going directly from the electronics to the electrodes and resonator within the vacuum sealed package.

This concludes the description including preferred embodiments of the present invention. The foregoing description including preferred embodiments of the invention has been presented for the purposes of illustration and description. It is not intended to be exhaustive or to limit the invention to the precise forms disclosed. Many modifications and variations are possible within the scope of the foregoing teachings. Additional variations of the present invention may be devised without departing from the inventive concept as set forth in the following claims.

What is claimed is:

1. A method for fabricating a microelectromechanical system (MEMS) resonator, comprising:
   providing a dielectric substrate having a resonator defined therein; and
   depositing a bilayer conductive coating on the dielectric substrate, the depositing of the bilayer conductive coating including
   (i) depositing a dielectric film on the dielectric substrate by Atomic Layer Deposition, and
   (ii) depositing a metal film on the deposited dielectric film by Atomic Layer Deposition, and
   wherein the bilayer conductive coating electrically couples the resonator to electronics.

2. The method of claim 1, wherein the bilayer conductive coating is deposited to a thickness of less than 100 nm.

3. The method of claim 1, wherein the metal film has a resistivity of $10^{-6}$ to $10^{-5}$ Ω-cm.

4. The method of claim 1, wherein the deposited bilayer conductive coating has a uniform thickness.

5. The method of claim 4, wherein the resonator has an aspect ratio greater than 2:1.

6. The method of claim 4, wherein the resonator has an aspect ratio greater than 5:1.

7. The method of claim 1, wherein the metal film is a noble metal.

8. The method of claim 7, wherein the noble metal is one of Ru, Rh, Pd, Re, Ir, or Pt.

9. The method of claim 1, wherein the metal film has a thickness of 1 nm to 20 nm.

10. The method of claim 1, wherein the metal film is a pure metal film.

11. The method of claim 1, wherein the dielectric substrate is one of quartz, fused quartz, or fused silica.

12. The method of claim 1, wherein:
the dielectric film is an $Al_2O_3$ amorphous film and the metal film is a noble metal film.

13. The method of claim 12, wherein:
the $Al_2O_3$ amorphous film is deposited to a thickness of 1 nm to 2 nm; and
the noble metal film is deposited to a thickness of 1 nm to 20 nm.

14. The method of claim 12, wherein the noble metal is one of Ru, Rh, Pd, Re, Ir, or Pt.

15. The method of claim 12, wherein the $Al_2O_3$ amorphous film reduces surface interfacial slippage and provides surface passivation.

16. A method for fabricating a microelectromechanical system (MEMS) resonator, comprising: providing a dielectric substrate having a resonator defined therein; depositing an $Al_2O_3$ amorphous film on the dielectric substrate by Atomic Layer Deposition; and depositing a noble metal film on the $Al_2O_3$ amorphous film by Atomic Layer Deposition, wherein the noble metal film for electrically couples the resonator to electronics.

17. The method of claim 16, wherein the deposited noble metal film has a resistivity of 1 to 50 µΩ-cm.

18. The method of claim 16, wherein the deposited noble metal film has a resistivity of $10^{-6}$ to $10^{-5}$ Ω-cm.

19. The method of claim 16, wherein the noble metal is one of Ru, Rh, Pd, Re, Ir, or Pt.

20. The method of claim 16, wherein the deposited $Al_2O_3$ amorphous film and the deposited noble metal film each have a uniform thickness.

21. The method of claim 16, wherein the deposited $Al_2O_3$ amorphous film reduces surface interfacial slippage and provides surface passivation.

22. The method of claim 16, further comprising:
placing the dielectric substrate in a vacuum chamber prior to depositing the $Al_2O_3$ amorphous film;
creating a vacuum in the vacuum chamber; and
depositing the $Al_2O_3$ amorphous film and the noble metal film without breaking the created vacuum.

* * * * *